(12) United States Patent
Fukuzumi

(10) Patent No.: US 7,084,028 B2
(45) Date of Patent: Aug. 1, 2006

(54) SEMICONDUCTOR DEVICE AND METHOD OF MANUFACTURING A SEMICONDUCTOR DEVICE

(75) Inventor: Yoshiaki Fukuzumi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 247 days.

(21) Appl. No.: 10/636,750

(22) Filed: Aug. 8, 2003

(65) Prior Publication Data

US 2004/0058506 A1 Mar. 25, 2004

(30) Foreign Application Priority Data

Aug. 8, 2002 (JP) .................................... 2002-231161

(51) Int. Cl.
*H01L 21/8242* (2006.01)
*H01L 29/94* (2006.01)

(52) U.S. Cl. .................. 438/244; 438/57; 438/366; 438/243; 438/245; 438/246; 257/301; 257/306; 257/315; 257/700

(58) Field of Classification Search ............. 438/244, 438/57, 386, 243, 245, 246; 257/301, 306, 257/315, 700

See application file for complete search history.

(56) References Cited

U.S. PATENT DOCUMENTS 5,427,975 A * 6/1995 Sparks et al. ................. 438/52
5,847,454 A * 12/1998 Shaw et al. .................. 257/734
5,943,581 A * 8/1999 Lu et al. ...................... 438/386
6,573,154 B1 * 6/2003 Sridhar et al. ............... 438/430
2002/0185469 A1 * 12/2002 Podlesnik et al. ............ 216/41
2003/0190766 A1 * 10/2003 Gonzalez et al. ............. 438/57

OTHER PUBLICATIONS

Takashi Ohsawa, et al., 9.1 "Memory Design Using One–Transistor Gain Cell on SOI", ISSCC, Feb. 5, 2002, 3 pages.

* cited by examiner

*Primary Examiner*—C Everhart
*Assistant Examiner*—Igwe U. Anya
(74) *Attorney, Agent, or Firm*—Oblon, Spivak, McClelland, Maier & Neustadt, P.C.

(57) ABSTRACT

A semiconductor device comprises a semiconductor substrate having a cavity region inside; a first insulation film formed on the inner wall of the cavity region; a first electrode formed on the inner wall of the first insulation film in the cavity region, and having a hollow cavity inside; a semiconductor region overlying the cavity region and including first semiconductor regions of a first conductivity type and second semiconductor regions of a second conductivity type which are adjacent to each other, said semiconductor region having a bottom surface on which the first electrode is formed via the first insulation film; a second insulation film covering the top surface of the semiconductor region; and a second electrode formed on the semiconductor region via the second insulation film and electrically insulated from the semiconductor region and the first electrode.

23 Claims, 18 Drawing Sheets

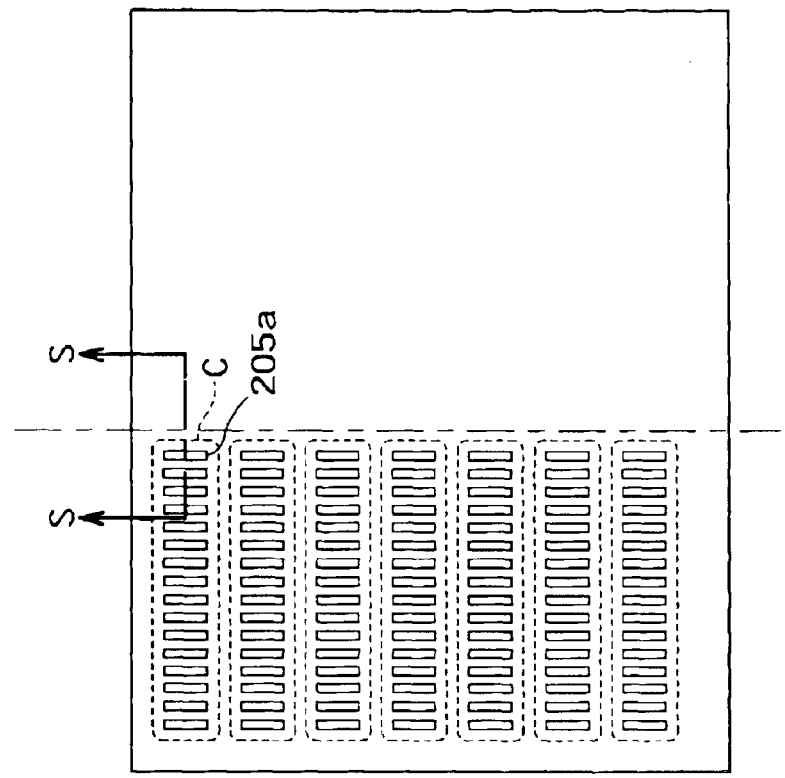
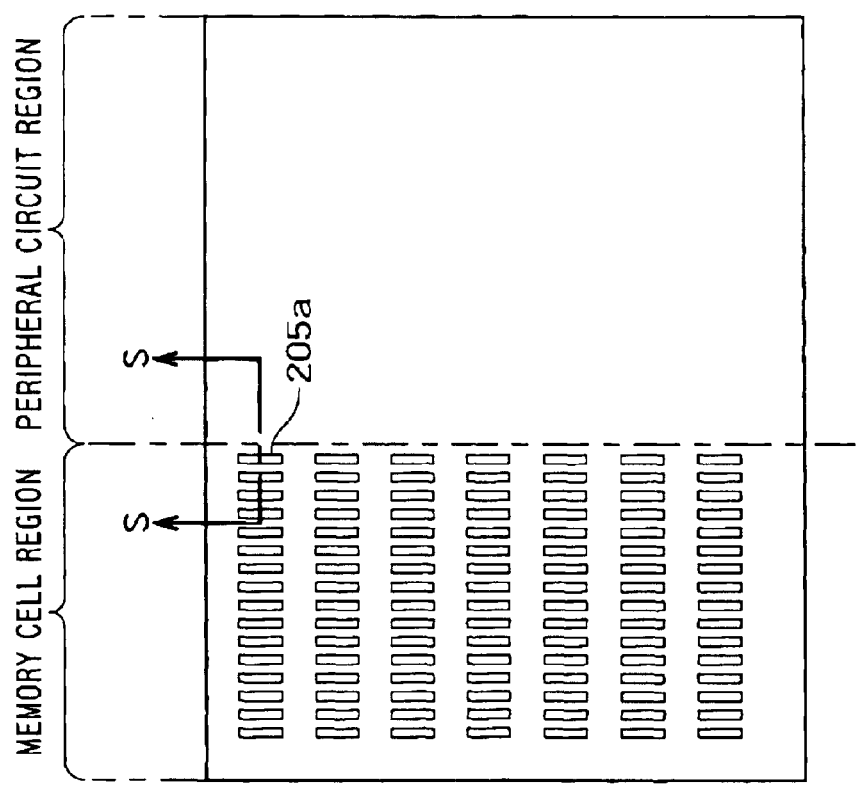

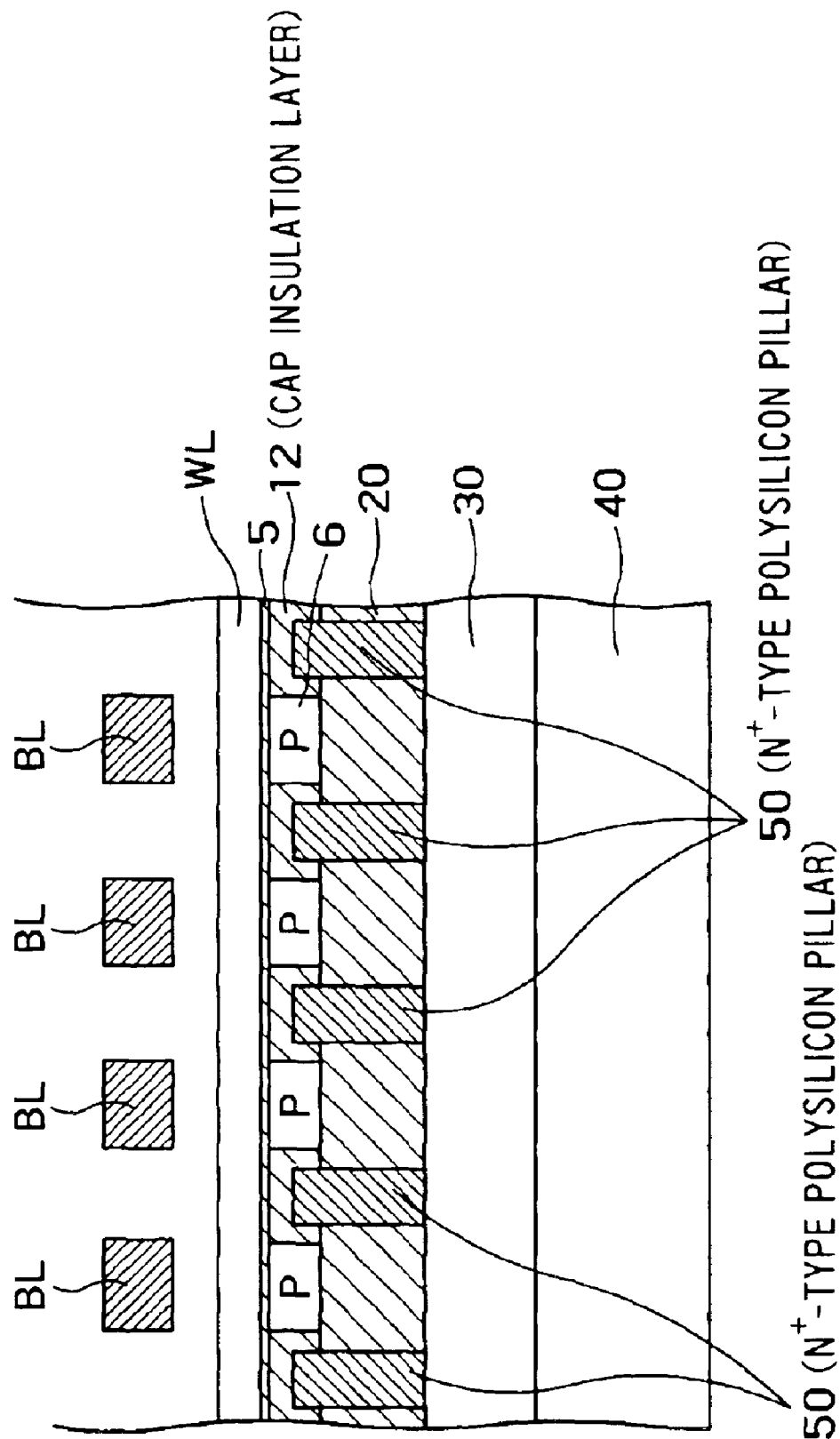

SEMICONDUCTOR DEVICE AND METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 2002-231161, filed on Aug. 8, 2002, the entire contents of which are incorporated herein by reference.

BACKGROUND OF THE INVENTION

1. Field of the Invention

This invention relates to a semiconductor device and a method of manufacturing a semiconductor device.

2. Related Background Art 1T-1C (1 transistor-1 capacitor) DRAMs have been used widely for years. It is becoming more and more difficult to reduce the cell size of these 1T-1C DRAMs. Under the circumstances, semiconductor devices with new structures are in demand.

On the other hand, development of system LSIs incorporating a semiconductor storage device such as DRAM and a logic LSI is progressing. In a manufacturing process of a DRAM-incorporated system LSI, it is desirable that the manufacturing process of the progressive high-speed logic LSI and the manufacturing process of DRAM match well.

From this point of view, a FBC cell (floating body transistor cell) has been reported. The FBC cell is a semiconductor storage device based on a 1T-1C DRAM, and an article on it is found in "Memory Design Using One-Transistor Gain Cell on SOI" (T. Ohsawa et al., ISSCC2002, Lecture No. 9.1). FIGS. 16 through 18 show the structure of this FBC cell.

FIG. 16 is a plan view of a part of a FBC cell. Bit lines BL extend latitudinally when viewed in FIG. 16. Under the bit lines BL, word lines WL and source lines SL extend longitudinally when viewed in FIG. 16 (vertically with respect to the bit lines BL).

FIG. 17 is a cross-sectional view taken along the X—X line (word lines WL) of FIG. 16. The bit lines BL are electrically connected by BL contacts to N-type diffusion layers 2 lying on a surface region of the semiconductor substrate. The word lines WL are electrically insulated by a gate insulation film 5 from P-type diffusion layers 6 lying in the surface region of the semiconductor substrate. The source lines SL are electrically connected to N-type diffusion layers 4 lying in areas opposite from the N-type diffusion layers 2 with respect to the word lines WL. Thus formed are MOS transistors each having a word line WL as its gate electrode and a bit line BL as its drain electrode.

The surface region 10 of the semiconductor substrate is composed of an alternately adjacent alignment of the N-type diffusion layers 2, 4 and the P-type diffusion layers 6. The surface region 10 of the semiconductor substrate is insulated by an insulation layer 20 from an $N^+$-type diffusion layer 30 and a P substrate 40 underlying the insulation layer 20 to form a SOI structure.

FIG. 18 is a cross-sectional view taken along the Y—Y line (word lines WL) of FIG. 16. The word lines WL extend under the bit lines BL, and the P-type diffusion layers 6 extend below the word lines WL via the gate insulation film 5. In this cross-sectional view, each P-type diffusion layer 6 is surrounded by a gate insulation film 5, CAP insulation layer 12 and an insulation layer 20 that are made of insulating materials.

$N^+$-type polysilicon pillars 50 are formed to extend from the CAP insulation layers 12 near the P-type diffusion layers 6 through the insulation layer 20 and reach the $N^+$-type type diffusion layer 30. Distance from each $N^+$-type polysilicon pillar 50 to a nearest P-type diffusion layer 6 is much shorter than the distance from the $N^+$-type diffusion layer 30 to the P-type diffusion layer 6. Therefore, capacitance between the $N^+$-type diffusion layer 30 and the P-type diffusion layer 6 becomes much larger than the capacitance in a structure without the $N^+$-type polysilicon pillar 50.

This semiconductor storage device operates as explained below.

As shown in FIG. 17, each MOS transistor having a word line WL as its gate electrode and a bit line BL as its drain electrode permits a current to flow between the word line WL and an associated source line SL when a positive voltage is applied to the word line WL. This current causes impact ionization, and positive and negative electric charges are produced in the P-type diffusion layer 6. At that time, a negative voltage is applied to the $N^+$-type diffusion layer 30 and the $N^+$-type polysilicon pillar shown in FIG. 18, and holes are stored in the P-type diffusion layer 6.

After that, when the voltage applied to the word line WL is changed to a negative voltage, a reverse bias is applied to PN junctions between the P-type diffusion layer 6 and the N-type diffusion layers 2, 4. Therefore, holes are retained in the P-type diffusion layer 6 even after the MOS transistor is turned OFF. As a result, data are retained in the semiconductor storage device.

In this semiconductor storage device, since the capacitance between each P-type diffusion layer 6 and the $N^+$-type diffusion layer 30 is increased by forming the $N^+$-type polysilicon pillar 50 near the P-type diffusion layer 6, a larger quantity of holes can be retained in the P-type diffusion layer 6.

This semiconductor storage device uses a SOI substrate. There are SIMOX and bonding techniques as manufacturing methods of SOI substrates.

The SIMOX technique injects oxygen ions from a surface of a silicon substrate to a depth of approximately 100 nm to 500 nm. The ion injection invites crystalline defects in the SOI portion formed along the surface region of the semiconductor substrate. Individual memory cells of the FBC cell are very small. Hence, even a slight increase of junction leakage by small crystalline defects may cause incorrect operations of the semiconductor storage device.

In case of the bonding technique, there is a limit to thinning the BOX layer (corresponding to the insulating layer 20). This involves the problem that thinning the BOX layer beyond a certain extent is technically difficult and that the BOX layer must be thick to a certain extent in the peripheral logic circuit portion of the system LSI.

That is, if the bonding technique is used, thickness of the BOX layer is technically limited from 100 nm to 150 nm at minimum.

In order to further increase the capacitance between each P-type diffusion layer 6 and the $N^+$-type diffusion layer 30 in the system LSI, the BOX layer (insulating layer 20) under the FBC cell portion had better be thinner. The peripheral logic circuit portion, however, requires a BOX layer of a certain thickness to prevent capacitive coupling between the silicon substrate under the BOX layer and circuit elements. Therefore, in the system LSI, performance of the FBC cell and performance of the peripheral logic circuit portion are in a trade-off relationship with regard to thickness of the BOX layer. Though not impossible, it is not practical because of a high cost to form a BOX layer locally varying in thickness by the bonding technique.

There is therefore a demand for an inexpensive semiconductor device which has less crystalline defects along the surface region of the semiconductor substrate for making elements thereon and which is capable of reliably holding data, and a method for reliably manufacturing the semiconductor device.

SUMMARY OF THE INVENTION

A semiconductor device comprises a semiconductor substrate having a cavity region inside; a first insulation film formed on the inner wall of the cavity region; a first electrode formed on the inner wall of the first insulation film in the cavity region, and having a hollow cavity inside; a semiconductor region overlying the cavity region and including first semiconductor regions of a first conductivity type and second semiconductor regions of a second conductivity type which are adjacent to each other, said semiconductor region having a bottom surface on which the first electrode is formed via the first insulation film; a second insulation film covering the top surface of the semiconductor region; and a second electrode formed on the semiconductor region via the second insulation film and electrically insulated from the semiconductor region and the first electrode.

A semiconductor device comprises a semiconductor substrate having a cavity region inside; a first insulation film formed on the inner wall of the cavity region; a first gate electrode filled inside the first insulation film in the cavity region, and electrically insulated from the semiconductor region by the first insulation film; a semiconductor region overlying the cavity region and including first semiconductor regions of a first conductivity type and second semiconductor regions of a second conductivity type which are adjacent to each other, said semiconductor region having a bottom surface on which the first gate electrode is formed via the first insulation film; a second insulation film formed on the top surface of the semiconductor region; a third insulation film thicker than the first insulation film and the second insulation film and covering side surfaces of the semiconductor region; and a second gate electrode formed on the top surface of the semiconductor region via the second insulation film and electrically insulated from the semiconductor region and the first gate electrode.

A method of manufacturing a semiconductor device, comprises forming a trench in a surface region of a semiconductor substrate; forming a coating film covering sidewalls of the trench; etching isotropically the semiconductor substrate from the bottom of the trench to make a hollow cavity having an extension in the horizontal direction relative to the top surface of the semiconductor substrate and an extension in the vertical direction relative to the top surface of the semiconductor substrate; and forming an element in the semiconductor region overlying the cavity in the semiconductor substrate.

A method of manufacturing a semiconductor device, comprises forming a plurality of trenches in a SOI substrate having a semiconductor layer on an insulation layer, said trenches extending from the top surface of the semiconductor layer and reaching the insulation layer of he SOI substrate; etching isotropically the insulation layer of the SOI substrate from the bottom of the trench, and removing a part of the insulation layer underlying the semiconductor layer between adjacent trenches; forming a first insulation film substantially uniform in thickness on the bottom surface and side surfaces of a semiconductor region, said semiconductor region being the part of the semiconductor layer without the insulation layer below; forming a first electrode insulated from the semiconductor layer on side surfaces and bottom surface of the semiconductor region via the first insulating film; forming a second insulation film on the top surface of the semiconductor region; and forming a second electrode insulated from the semiconductor region and the first electrode on the semiconductor region via the second insulation film.

A method of manufacturing a semiconductor device, comprises injecting impurity ions from the top surface of a semiconductor substrate and thereby forming an impurity layer; forming a trench from the top surface of the semiconductor substrate to reach the impurity layer; forming a coating film which covers side walls of the trench; etching isotropically the semiconductor substrate from the bottom of the trench and thereby removing the impurity region in a horizontal direction relative to the top surface of the semiconductor substrate; and forming an element in a semiconductor region overlying a cavity made by the removal of the impurity layer.

BRIEF DESCRIPTION OF THE DRAWINGS

FIG. 7A is a plan view of a silicon substrate 110 after having formed trenches 205;

FIG. 7B is a plan view of the silicon substrate 110 after having formed cavity regions C;

FIG. 18 is a cross-sectional view taken along the Y—Y line (word lines WL) of FIG. 16.

DETAILED DESCRIPTION OF THE INVENTION

Embodiments of the invention will now be explained below with reference to the drawings. These embodiments, however, should not be construed to limit the invention. Even if the embodiments explained below are modified by using N-type semiconductors in lieu of P-type semiconductors and using P-type semiconductors in lieu of N-type semiconductors, it is still possible to obtain the effects of the invention or embodiments.

Figure 1:
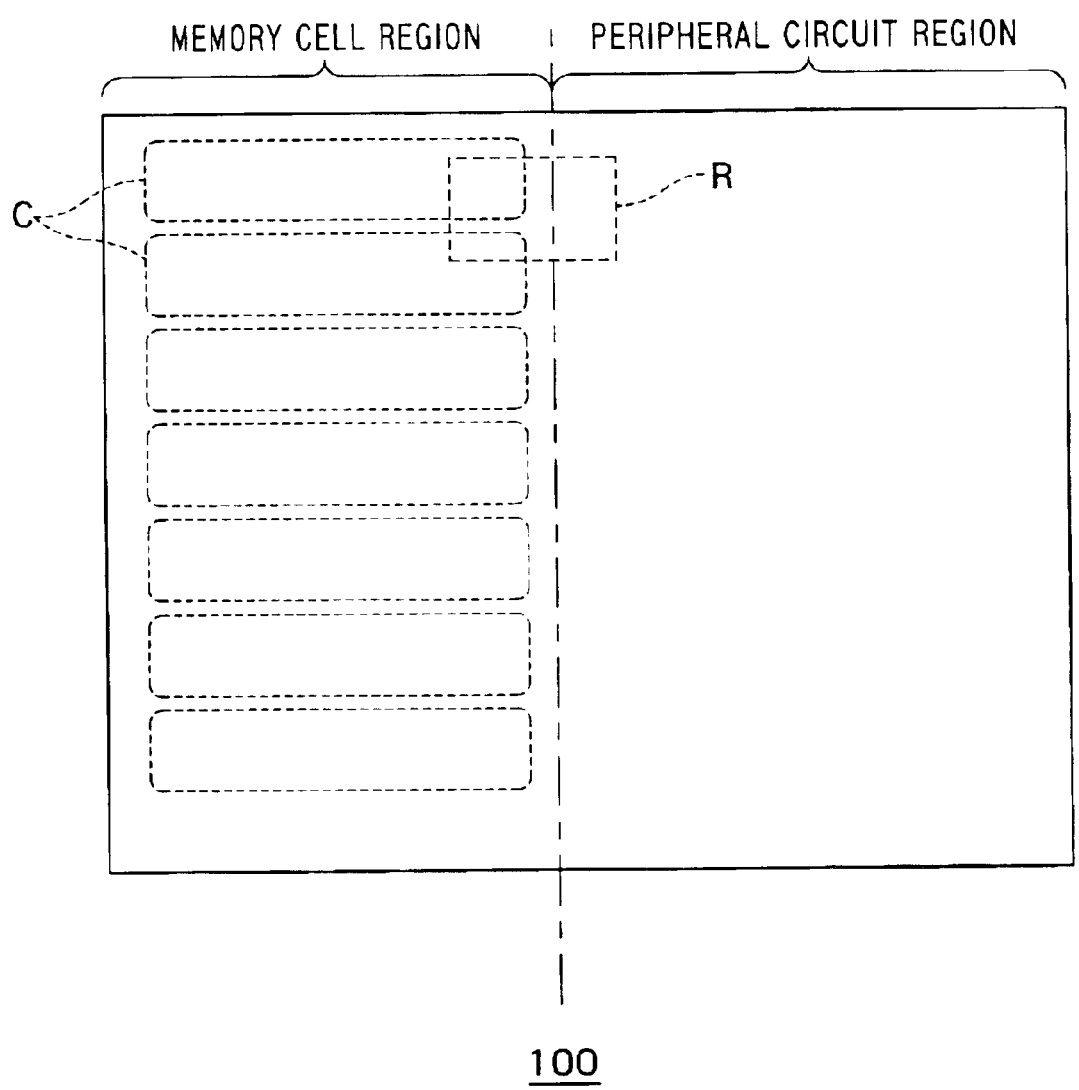
FIG. 1 is a plan view of a semiconductor device according to the first embodiment of the invention.

FIG. 1 is a plan view of a semiconductor device 100 according to the first embodiment of the invention. The semiconductor device 100 is a system LSI incorporating memory cells and peripheral logic LSIs on a common chip. FIG. 1 shows a memory cell region on the left of the alternate long and short dash line in the center and a peripheral circuit region on the right of the same line. Rectangles defined by broken lines indicate the position of cavity regions C in the semiconductor substrate.

Figure 2:
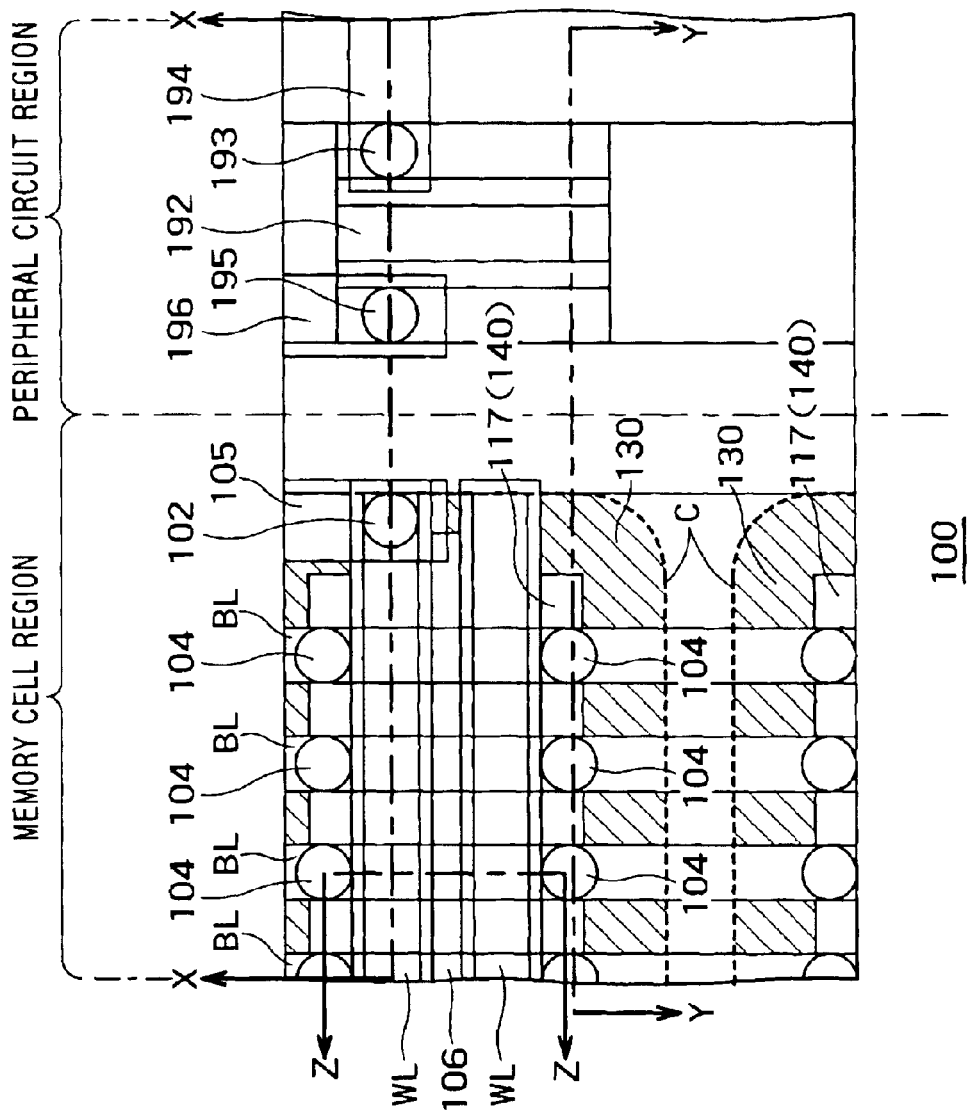
FIG. 2 is an enlarged plan view of the portion R surrounded with a broken line of FIG. 1.

FIG. 2 is an enlarged plan view of the portion R surrounded with a broken line. In the memory cell region, two word lines WL extend above each cavity region C in parallel with each other along the lengthwise direction of the cavity regions C. Still in the memory cell region, a plurality of bit lines BL extend above the word lines WL in directions across the cavity regions C to approximately intersect with the word lines WL. Between the two word lines WL above each cavity region C, a common source 106 is formed.

The word lines WL are electrically connected to a WL wiring 105 on a common plane with the bit lines BL by WL contacts 102. The bit lines BL are electrically connected to the diffusion layer (not shown in FIG. 1) formed on the silicon substrate by BL contacts 104.

Doped polysilicon 130 containing an impurity (such as arsenic (As)) is formed in each cavity region C, and a cavity 140 is formed inside the doped polysilicon 130. In other words, inner walls of the cavities 140 are made of doped polysilicon 130 and continuous in the lengthwise direction of the polysilicon 130. A cap 117 in form of a silicon oxide film overlies the cavities 140. Therefore, the cap 117 appears on the surface of the element in the plan view of FIG. 2.

When a voltage is applied to word lines WL, a channel on the surface of the semiconductor substrate under the word lines WL reverses. Responsively, bit lines BL and a common source line 106 become conductive to one another to permit data to be written and read out.

In the peripheral circuit region, a drain electrode 194 and a source electrode 196 are formed on opposite sides of a gate electrode 192. The drain electrode 194 and the source electrode 196 are electrically conductive to the diffusion layer on the surface of the silicon substrate via contacts 193, 195, respectively.

Figure 3:
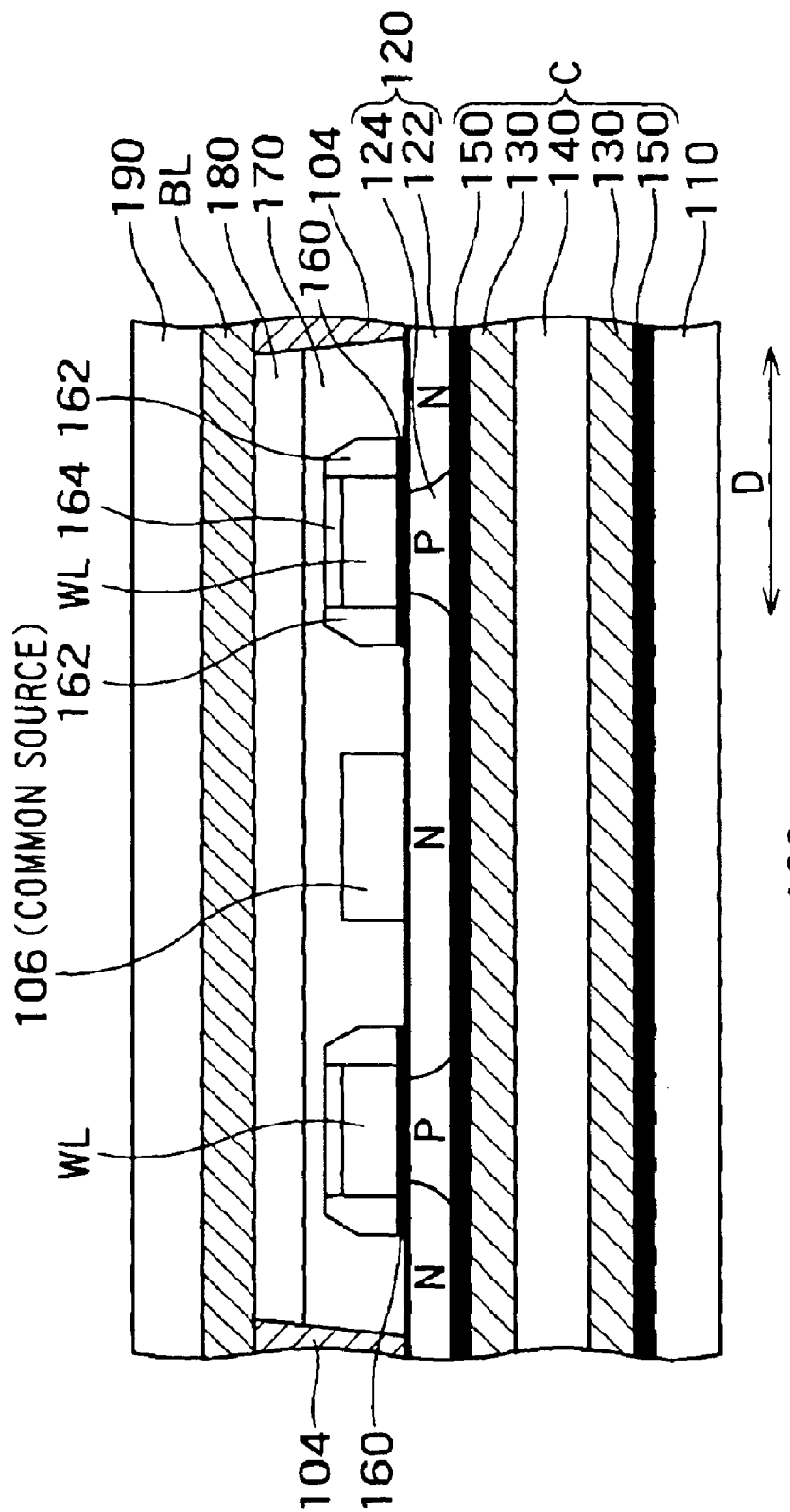
FIG. 3 is a cross-sectional view of a memory cell region of the semiconductor device 100 taken along the Z—Z line of FIG. 2.

FIG. 3 is a cross-sectional view of a memory cell region of the semiconductor device 100 taken along the Z—Z line of FIG. 2. The semiconductor device 100 includes the silicon substrate 110 and a semiconductor region 120. A semiconductor region 120 is composed of N-type semiconductor regions 122 and P-type semiconductor regions 124 that are alternately adjacent to one another on the surface region of the silicon substrate 110. The arrow mark D indicates the direction of abutment of the N-type semiconductor regions 122 and the P-type semiconductor regions 124 in the semiconductor region 120.

A silicon oxide film 150 is formed on the bottom surface of the semiconductor region 120, and N$^+$-type doped polysilicon 130 is formed under the silicon oxide film 150. The silicon oxide film 150 insulates the semiconductor region 120 and the doped polysilicon 130 from each other.

A cavity 140 extends under the doped polysilicon 130, and the doped polysilicon 130 and the silicon oxide film 150, further, appear under the cavity 140.

Figure 4A:
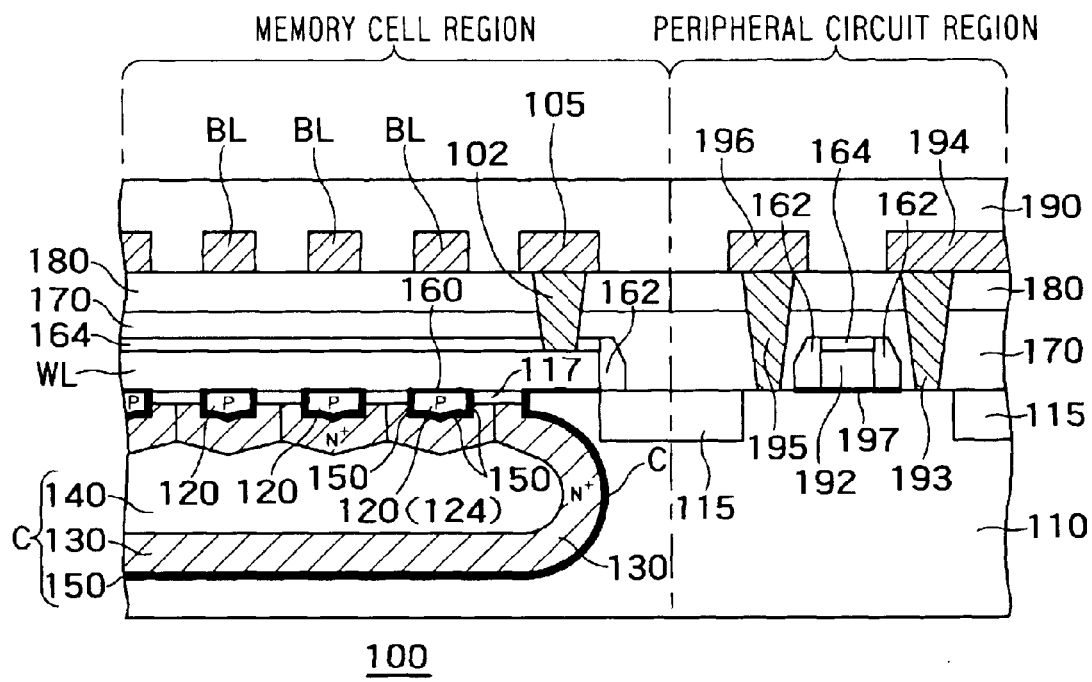
FIG. 4A is a cross-sectional view of the semiconductor device 100 taken along the X—X line of FIG. 2.
Figure 4B:
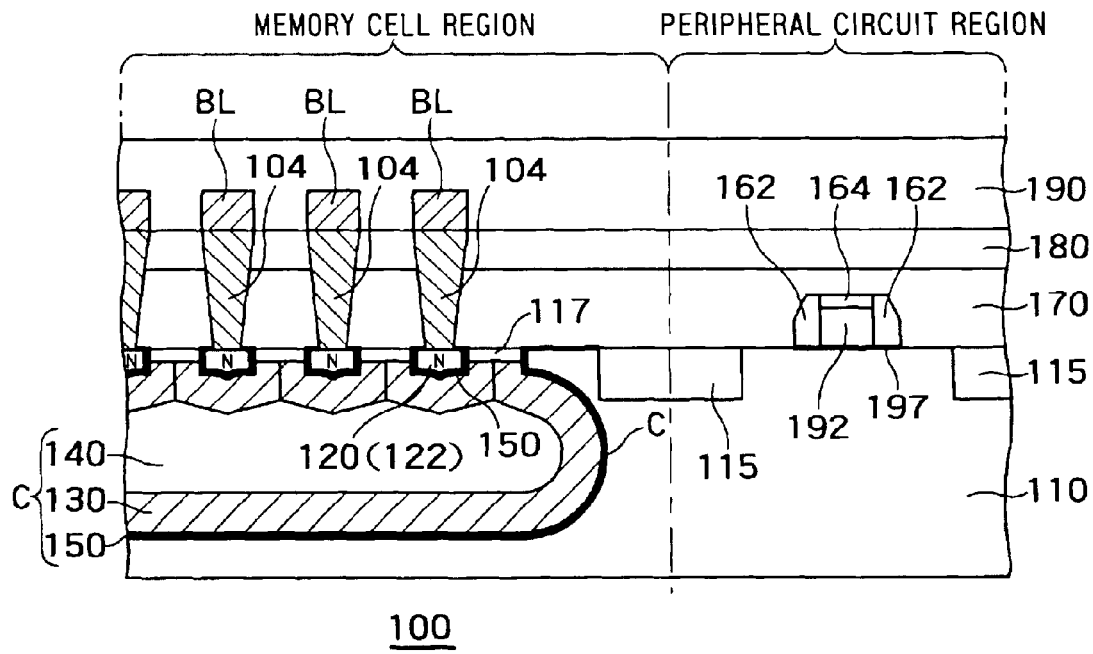
FIG. 4B is a cross-sectional view of the semiconductor device 100 taken along the Y—Y line of FIG. 2.

The doped polysilicon 130 and the silicon oxide film 150 appear twice to sandwich the cavity 140 because, as shown in FIGS. 4A and 4B, the silicon oxide film 150 and the doped polysilicon 130 are deposited in this order on the inner surface of the cavity region C. In other words, therefore, the doped polysilicon 130 is formed inside the silicon oxide film 150, and the cavity 140 extends inside the doped polysilicon 130.

Word lines WL made of P-type doped polysilicon extend over the P-type semiconductor regions 124 via gate insulation films 160. The word lines WL are covered by sidewalls 162 of an insulating material and silicide layers 164.

The N-type semiconductor regions 122 electrically connect to the source electrodes 106 or BL contacts.

A BPSG film 170 is formed on word lines WL and common source electrodes 106 to protect them, and a silicon oxide film 180 overlies the BPSG film 170.

Since the Z—Z line of FIG. 2 is taken in parallel to the bit lines BL, a bit line BL appears in FIG. 3 to extend horizontally on the silicon oxide film 180. The bit lines BL are electrically connected to the N-type semiconductor regions 122 by BL contacts 104. An N-type semiconductor region 122 in connection to the bit line BL and an N-type semiconductor region 122 in connection to a source electrode 106 are located on opposite sides of a p-type semiconductor region 124.

As explained above, N-type semiconductor regions 122 and P-type semiconductor regions 124 are adjacent to each other. If FBC cells are extremely microminiaturized and the length of each N-type semiconductor region 122 in the lengthwise direction of the bit lines decreases to approximately 0.1 μm or less, bipolar operations between adjacent memory cells become non-negligible. For example, in case of the instant embodiment, operations of the PNP bipolar transistor composed of the P-type semiconductor region 124, N-type semiconductor region 122 and P-type semiconductor region 124 cannot be disregarded. Such bipolar behaviors may invite interference between one data in a memory cell and another stored in another memory cell and may hence invite destruction of those data.

In order to prevent the problem, the N-type semiconductor regions 122 are locally etched to form slits (not shown), thereby isolating the N-type semiconductor regions 122 for individual memory cells. The slits may be used without any filling materials. However, they may be filled with polysilicon, insulating film, metal, or the like, or amorphous silicon or a high-concentrated impurity-diffused layer may be formed therein. Thus an isolation layer (not shown) is formed in the N-type semiconductor regions 122, and prevents the N-type semiconductor regions 122 and the P-type semiconductor regions 124 from making PNP bipolar transistors. As a result, holes in an N-type semiconductor region 122 of a certain memory cell vanish without moving to another N-type semiconductor region of an adjacent memory cell. Therefore, data interference between memory cells can be prevented even when FBC cells are microminiaturized to a higher level.

The slits are formed by forming a sidewall (not shown) in form of a silicon oxide film, for example, on the side surfaces of the sidewall 162 and by etching the N-type semiconductor regions 122 in a self-aligned manner via the additional sidewall used as a mask. Then, the slit may be filled with polysilicon, insulating film, metal, or the like.

In case that amorphous silicon or a high-concentrated, impurity-diffused layer is formed as the isolation layer, ions may be injected into the N-type semiconductor regions 122 in a self-aligned manner by using as a mask an additional sidewall (not shown) formed on side surfaces of the sidewall 162.

FIG. 4A is a cross-sectional view of the semiconductor device 100 taken along the X—X line of FIG. 2. Since the X—X line is taken along the word lines WL, a word line WL appears in FIG. 4A to extend horizontally. The P-type regions 124 of the semiconductor region 120 underlying the word line WL appear in FIG. 4A, but N-type regions 122 thereof do not appear.

The section shown in FIG. 4A is a cross-sectional plane substantially perpendicular to the arrow mark D shown in FIG. 3. That is, it is a cross-sectional plane substantially perpendicular to the direction of adjacent alignment of the N-type semiconductor regions 122 and the P-type semiconductor regions 124 in the semiconductor region 120. In the cross section shown here, the bottom surface and side surfaces of the semiconductor region 120 are coated by a silicon oxide film 150. The silicon oxide film 150 is substantially uniform in thickness throughout the entire bottom and side surfaces of the semiconductor region 120. A gate insulation film 160 is further formed on the top surface of the semiconductor region 120. Therefore, in the cross section shown in FIG. 4A, the semiconductor region 120 is covered all around by the silicon oxide film 150 and the gate insulation film 160. That is, the semiconductor region 120 is an FBC memory cell.

According to the embodiment taken here, the gate insulation film 160 is thinner than the silicon oxide film 150. For example, the silicon oxide film 150 is about 10 nm thick whereas the gate insulation film 160 is about 5 nm thick. Although the gate insulation film 160 is formed on a flat plane, the silicon oxide film 150 is formed not only on a flat plane but also on a curved surface as explained later. Therefore, the silicon oxide film 150 is formed to be thicker than the thickness of the gate insulation film 160.

The bottom surface of the semiconductor region 120 has tapers that downwardly project from the surface of the silicon substrate 110. The silicon oxide film 150 is formed along their bottom surfaces.

The doped polysilicon 130 is formed on side surfaces and bottom surface of the semiconductor region 120 via the silicon oxide film 150. Since the doped polysilicon 130 is deposited on the inner wall of the cavity region C, upper and lower parts of the doped polysilicon 130 over and under the cavity 140 merge at ends of the cavity region C. Similarly, upper and lower parts of the silicon oxide film 150 over and under the cavity 140 merge at ends of the cavity region C. Contacts are formed in the doped polysilicon 130 such that a voltage can be applied from outside. For example, contact plugs (not shown) may be formed to penetrate a BPSG film 170, silicon oxide film 180 and cap 117, and a wiring (not shown) connected to the contact plugs may be formed on the plane common to the bit lines BL.

The word lines WL are covered by sidewalls 162 and a silicide layer 164, and still around them, the BPSG film 170 and the silicon oxide film 180 are provided. Bit lines BL are illustrated in a cross-sectional view on the silicon oxide film 180. AWL wiring 105 connected to the word lines WL lies over the silicon oxide film 180 via a WL contact 102.

In the peripheral circuit region electrically insulated from the memory cell region by the element isolation region 115, various circuit elements are provided. FIG. 4A shows a cross-sectional view of a MOS transistor that is representative of various circuit elements.

A gate electrode 192 is formed on the top surface of the silicon substrate 110 via a gate insulation film 197. The gate electrode 192 is covered by the sidewalls 162 and the silicide layer 164, and still around them, the BPSG film 170 and the silicon oxide film 180 are formed. On the silicon oxide film 180, a drain electrode 194 and a source electrode 196 are formed. The drain electrode 194 and the source electrode 196 are electrically connected to the diffusion layer formed on the top surface of the silicon substrate 110 by contacts 193, 195, respectively.

FIG. 4B is a cross-sectional view of the semiconductor device 100 taken along the Y—Y line of FIG. 2. Since the Y—Y line is taken along the alignment of the BL contacts 104 in the memory cell region, the BL contacts 104 appear in FIG. 4B such that their cross sections align side by side in the horizontal direction. The N-type semiconductor regions 122 of the semiconductor region 120 appear on FIG. 4B in connection with the BL contacts 104, but the P-type semiconductor regions 124 do not appear here.

The other structural features of the memory cell region shown in FIG. 4B are identical to those of the memory cell region shown in FIG. 4A, and their explanation is omitted here.

In the peripheral circuit region shown in FIG. 4B, the Y—Y line does not run across the drain electrode 194, source electrode 196 and contacts 193, 195. Therefore, the drain electrode 194, source electrode 196 and contacts 193, 195 do not appear on FIG. 4B. The other structural features of the peripheral circuit region are identical to those of FIG. 4A, and their explanation is omitted here.

Next explained are the operations of the memory cell region of the semiconductor device 100.

As shown in FIG. 3, MOS transistors are formed in the memory cell region, which include the word lines WL as gates, bit lines BL as drains and common source electrode 106 as sources. When a positive voltage is applied to a word line WL, a channel is formed in a surface region of the P-type semiconductor region 124, and a current flows between the bit line BL and the common source electrode 106. This current brings about impact ionization, and positive and negative electric charges are generated in the P-type semiconductor region 124.

Responsively, a negative voltage is applied to the doped polysilicon 130 shown in FIGS. 3, 4A and 4B, and holes are stored in the P-type semiconductor region 124.

When the voltage applied to the word line WL is thereafter changed to a negative voltage, a reverse bias is applied to the PN junction between the P-type semiconductor region 124 and the N-type semiconductor region 122. As a result, even after the MOS transistor shown in FIG. 3 is turned OFF, the holes are retained in the P-type semiconductor region 124. In this manner, data is retained in the semiconductor storage device. The doped polysilicon 130 functions as an electrode for having electric charges stay in the P-type semiconductor regions 124.

As shown in FIG. 18, the existing FBC cell makes use of capacitive coupling between a P-type diffusion layer 6 and an N$^+$-type diffusion layer 30 via a CAP insulation layer 12 and an insulation layer 20 in order to efficiently store charges in the P-type diffusion layer 6. However, since the insulation layer 20 is a BOX layer as thick as 100 nm or more, most of the capacitance between the P-type diffusion layer 6 and the N$^+$-type diffusion layer 30 is capacitance obtained through the CAP insulation layer 12.

In contrast, in the embodiment of the invention shown here, thickness of the silicon oxide film 150 covering the bottom surface and side surfaces of the semiconductor region 120 is approximately 10 nm, and it is much thinner than the insulation layer 20 in the existing FBC cell. Therefore, capacitance can be obtained not only through the sidewalls of the semiconductor region 120 but also through its bottom surface. As a result, capacitance between the P-type semiconductor region 124 and the doped polysilicon 130 becomes larger than the capacitance between the P-type diffusion layer 6 and the N$^+$-type diffusion layer 30 in the existing FBC cell. Thus, the semiconductor device according to the embodiment is enhanced in data retention ability of the memory cells than the existing technique.

As shown in FIGS. 4A and 4B, the bottom surface of the semiconductor region 120 is shaped to project downwardly, and the area of the bottom surface is larger than that of the semiconductor region having the flat bottom surface. This feature also contributes to increasing the capacitance between the P-type semiconductor region 124 and the doped polysilicon 130.

In the instant embodiment, two word lines WL are associated with each cavity region C as shown in FIG. 2. Additionally, the doped polysilicon 130 is provided independently to prevent each cavity region C from electrically connecting to the doped polysilicon 130 in an adjacent cavity region C. Therefore, the instant embodiment can control the potential of the doped polysilicon 130 independently for each cavity region C.

In the existing FBC cell, since the N$^+$-type diffusion layer 30 under the insulation layer (BOX layer) 20 extends over the entire cell array in the memory cell region, when the potential of the N$^+$-type diffusion layer 30 is raised upon reading a certain memory cell, it may invite deterioration of retention characteristics of other memory cells.

In the instant embodiment, however, since the voltage can be raised exclusively in the doped polysilicon 130 required upon reading a certain memory cell, deterioration of retention characteristics of other memory cells can be prevented.

From this point of view, it is desirable to provide individual cavity regions C independently for respective word lines WL.

However, in order to reduce the cost of memory cells, it is necessary to increase the number of word lines WL per unit area and thereby increase the ratio of memory cells on a semiconductor chip. Therefore, in case that cavity regions C are associated with respective word lines WL, cavity regions C equal in number to the word lines WL must be formed in a very small region, and the width of each cavity region C inevitably becomes very narrow. Once the cavity region C is narrowed, then the doped polysilicon 130 becomes narrower as well accordingly, and its resistance undesirably increases. Additionally, although silicide is often used as word lines WL, it is extremely difficult to use silicide as doped polysilicon in order to maintain the reliability of the semiconductor device 100. Therefore, resistance of the doped polysilicon 130 undesirably increases as compared with the word line WL.

As a result, the rise in voltage of the doped polysilicon 130 is delayed behind the rise in voltage of the word line WL. It is desirable that the word line WL and the doped polysilicon 130 are controlled synchronously; however, the RC delay of the doped polysilicon 130 may suppress the speed of entire operations of the memory cells.

That is, controllability of word lines WL and operation speed of memory cells are in a trade-off relation.

However, the embodiment shown here can adjust the number of word lines WL associated with single doped polysilicon 130, and can therefore attain both a speed-up of operations of memory cells and a cost reduction of the memory cells. For example, in order to reduce the resistance value of the doped polysilicon 130, word lines WL associated with the doped polysilicon 130 may be increased. In order to improve the controllability of word lines WL, word lines WL associated with single doped polysilicon 130 may be reduced.

The number of word lines WL associated with single doped polysilicon 130 is limited by the width of the doped polysilicon 130. Therefore, for the purpose of attaining both a speed-up of operations of memory cells and a cost reduction of memory cells, both the width of the doped polysilicon 130 and the number of word lines WL may be changed in design.

In the instant embodiment, the cavity 140 exists under the semiconductor region 120. This contributes to relaxing the stress applied to the semiconductor region 120 and alleviating unevenness of the junction leakage between the N-type semiconductor region 122 and the P-type semiconductor region 124.

Next explained is a manufacturing method of the semiconductor device 100.

Figure 5A:
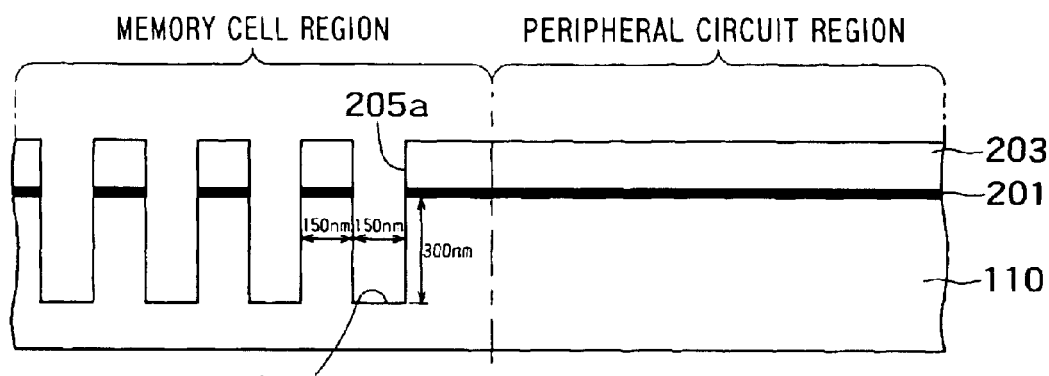
FIG. 5A is a cross-sectional view showing a manufacturing step of the semiconductor device 100.

FIGS. 5A through 6D are cross-sectional views showing the manufacturing method of the semiconductor device 100 in the order of its processes. With reference to FIG. 5A, a bulk silicon substrate 110 is first prepared, and a silicon oxide film 201, approximately 5 nm thick, is formed on the silicon substrate 110 to protect its surface. Thereafter, a silicon nitride film 203 is deposited on the silicon oxide film 201 to a thickness around 150 nm by CVD. Then the silicon oxide film 201 and the silicon nitride film 203 are patterned by photolithography and RIE.

Using the silicon nitride film 203 as a mask, the silicon substrate 110 is etched by RIE to form trenches 205 in the FBC memory cell region. Depth of the trenches 205 is approximately 300 nm from the top surface of the silicon substrate 110. In the instant embodiment, width of each trench 205 and distance between adjacent trenches 205 are approximately 150 nm, respectively.

Figure 6A:
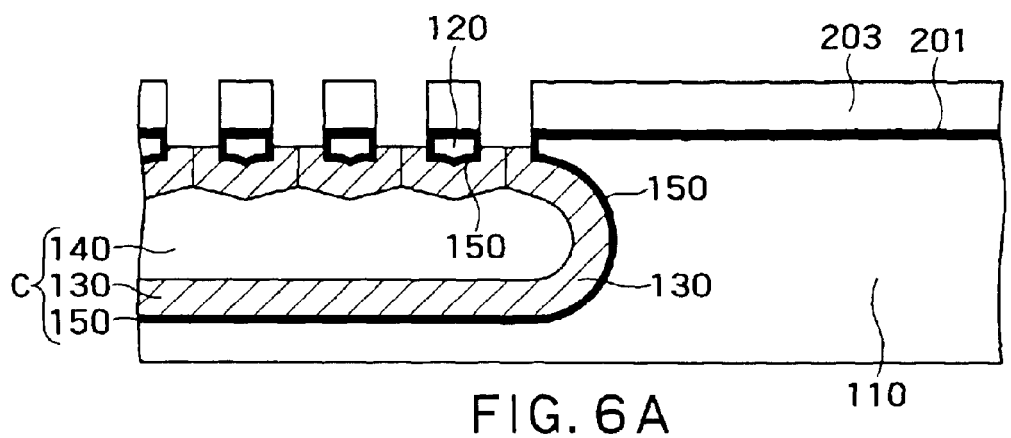
FIG. 6A is a cross-sectional view showing a manufacturing step of the semiconductor device 100 following FIG. 5D.

The silicon substrate 110 after having formed the trenches 205 is shown in a plan view of FIG. 7A. As shown in FIG. 7A, the trenches 205 have rectangular apertures 205a opening at the top surface of the silicon substrate 110. The apertures 205a align side by side in their widthwise direction, and this row is repeated in the lengthwise direction of the apertures 205a. The cross-sectional view of FIG. 6A is taken along the S—S line of FIG. 7A.

Figure 5B:
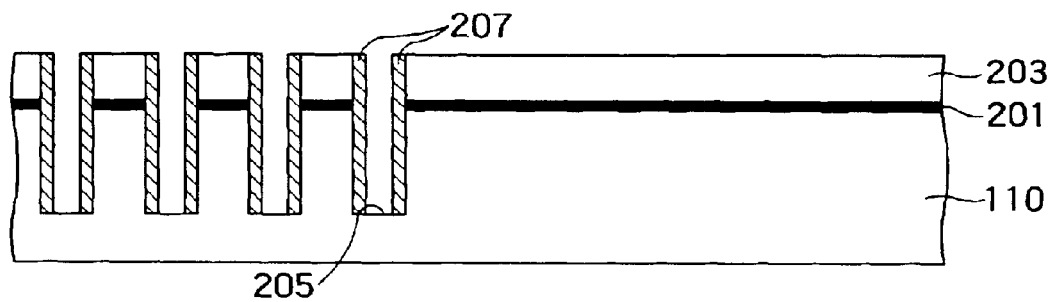
FIG. 5B is a cross-sectional view showing a manufacturing step of the semiconductor device 100 following FIG. 5A.

With reference to FIG. 5B, a silicon oxide film of TEOS, for example, is further deposited up to a thickness around 50 nm by CVD. Subsequently, the silicon oxide film is selectively etched by RIE to make out coating films 207 of silicon oxide on sidewalls of the trenches 205.

Figure 5C:
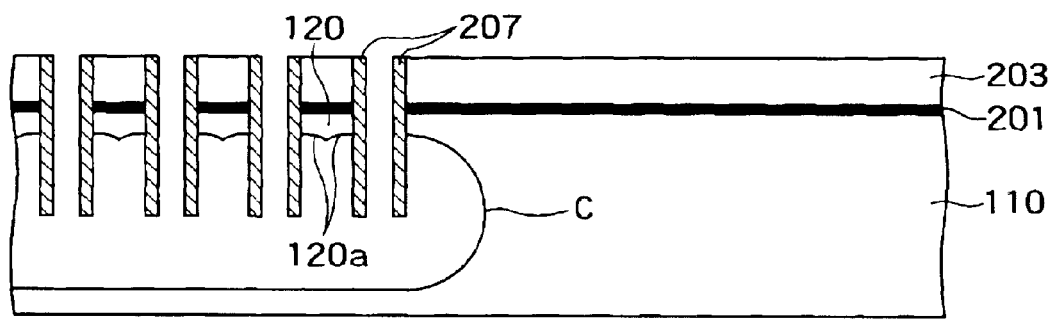
FIG. 5C is a cross-sectional view showing a manufacturing step of the semiconductor device 100 following FIG. 5B.

With reference to FIG. 5C, the silicon substrate 110 is isotropically etched from bottom portions of the trenches 205 by CDE (chemical dry etching). Since this etching is isotropic, the silicon substrate 110 is etched not only vertically to the top surface of the silicon substrate but also in parallel thereto from bottom portions of the trenches 205.

In this etching process, silicon single crystal is etched by approximately 200 nm. Since the width of the silicon region between adjacent trenches 205 is approximately 150 nm, the silicon regions between every adjacent trenches 205 are removed by the etching, and the trenches 205 merge at their bottoms. As a result, the cavity regions C are made out. Thus the hollow cavity regions C spanning in both the perpendicular and parallel directions with respect to the top surface of the silicon substrate 110 are formed in the silicon substrate 110.

On the other hand, since the trenches 205 are approximately 300 nm thick, silicon regions between every adjacent trenches 205 remain in the level of the top surface of the silicon substrate 110. These residual silicon regions become the semiconductor regions 120. Since the silicon regions are isotropically etched from bottom portions of the trenches 205 at opposite sides of each silicon region, tapers 120a appear on the bottom surfaces of the semiconductor regions 120. Because of these tapers 120a, the bottom surfaces of the semiconductor regions 120 are downwardly pointed.

Side surfaces of each semiconductor region 120 are determined by adjacent trenches 205, and their bottom surfaces are determined by respective cavity regions C. Therefore, the semiconductor regions 120 appear as floating in their cross-sectional view of FIG. 5C such that FBC memory cells can be formed in the semiconductor regions 120.

The silicon substrate 110 after having formed the cavity regions C is shown in the plan view of FIG. 7B. In FIG. 7B, cavity regions C are shown by broken lines. As shown in FIG. 7B, each cavity region C extends in the widthwise direction of the apertures 205a, and a plurality of cavity regions align side by side in the lengthwise direction of the apertures 205a. The cross-sectional view of FIG. 6C is taken along the S—S line of FIG. 7B.

Figure 5D:
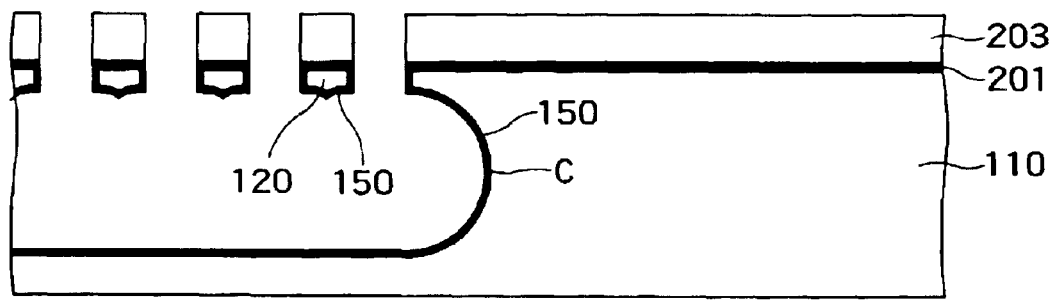
FIG. 5D is a cross-sectional view showing a manufacturing step of the semiconductor device 100 following FIG. 5C.

With reference to FIG. 5D, the coating films 207 are removed by treatment using hydrofluoric acid, and side and bottom surfaces of the semiconductor regions 120 and inner walls of the semiconductor regions 120 are annealed in an oxygen atmosphere. As a result of the annealing, a silicon oxide film 150 is formed on side and bottom surfaces of the semiconductor regions 120 and on the inner walls of the cavity regions C. Thickness of the silicon oxide film 150 is approximately 10 nm.

Referring to FIG. 6A, polysilicon doped with arsenic is deposited thereafter by CVD. Furthermore, the polysilicon deposited on the top surface of the silicon substrate 110 is thinned by etch-back technique using CDE to a depth around 70 nm from the top surface of the silicon substrate 110. As a result, the doped polysilicon 130 remains to cover side and bottom surfaces of the semiconductor regions 120 and inner walls of the cavity regions C. Through this process, cavities 140 surrounded by doped polysilicon 130 are made out.

Figure 6B:
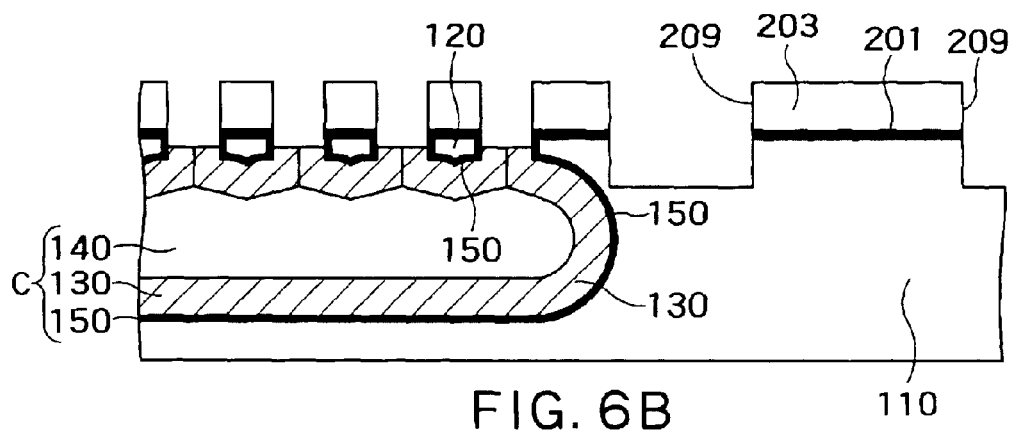
FIG. 6B is a cross-sectional view showing a manufacturing step of the semiconductor device 100 following FIG. 6A.
Figure 6C:
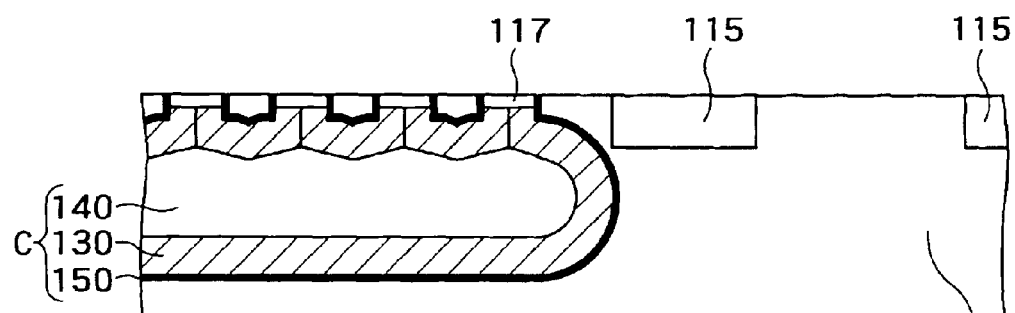
FIG. 6C is a cross-sectional view showing a manufacturing step of the semiconductor device 100 following FIG. 6B.

Referring to FIG. 6B, the silicon oxide film 201 and the silicon nitride film 203 are patterned by photolithography and RIE. Then using the silicon nitride film 203 as a mask, trenches 209 are formed in the peripheral circuit region of the silicon substrate 110.

Referring to FIG. 6C, a silicon oxide film is deposited, and it is partly removed together with the underlying silicon oxide film 201 and the silicon nitride film 203 by CMP or wet etching. As a result, element isolation portions 115 buried with the silicon oxide film are made out. In the process shown in FIG. 6A, the doped polysilicon 130 has been thinned by etch-back to a depth around 70 nm from the top surface of the silicon substrate 110. Therefore, in this process, caps 117 of the silicon oxide film are formed on the doped polysilicon 130 in the memory cell region.

Figure 6D:
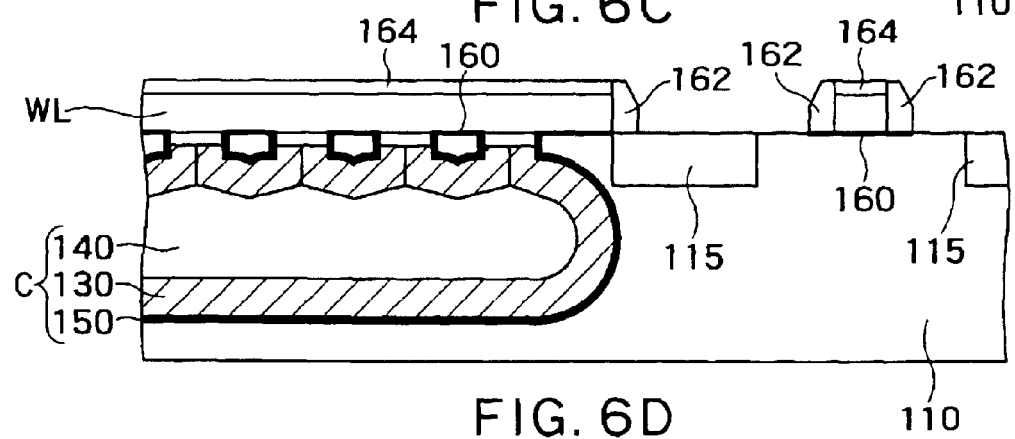
FIG. 6D is a cross-sectional view showing a manufacturing step of the semiconductor device 100 following FIG. 6C.

Referring to FIG. 6D, the top surface of the silicon substrate 110 is annealed in an oxygen atmosphere to form a sacrifice oxide film (not shown) on the top surface of the silicon substrate 110. After that, wells and channels are formed in the memory cell region and the peripheral circuit region by lithography and ion implantation. In the memory cell region, the P-type semiconductor regions 124 are made out through this step.

The sacrifice oxide film is next removed by treatment using hydrofluoric acid, and the gate insulation film 160 is formed thereafter on the top surface of the silicon substrate 110. In this embodiment, the gate insulation film 160 is a silicon oxide nitride film of a thickness around 5 nm.

After that, polysilicon is deposited on the gate insulating film 160, and gate electrodes 192 of the peripheral circuit region and word lines WL memory cell region are formed by photolithography and RIE.

Next using the pattern of the gate electrodes 192 and the word lines WL, a LDD diffusion layer (not shown) is formed in self-alignment.

Thereafter, sidewalls 162 in form of silicon nitride films are formed. Next using the sidewalls 162, source/drain diffusion layers (not shown) are formed in self-alignment in the peripheral circuit region. In the memory cell region, N-type semiconductor regions 122 are formed in the process of forming the source/drain diffusion layers.

A cobalt film is next deposited on gate electrodes 192 and word lines WL, and it is annealed to form a silicide layer 164.

A BPSG film 170 is further deposited, and its surface is smoothed by CMP. After that, the BPSG film 170 and the gate insulating film 160 are patterned by photolithography and RIE, and $N^+$ polysilicon is deposited. Then an upper part of the $N^+$ polysilicon is removed by CDE to make out the common source electrode 106. FIG. 6D is the cross-sectional view taken along a plane parallel to the word lines WL, and the common source electrode 106 does not appear here.

Again referring to FIGS. 4A and 4B, a silicon oxide film 180 is deposited to thereby form contacts 102, 104, 193, 195. After that, bit lines BL, source wiring 105, drain electrode 194 and source electrode 196. When a protective film 190 is next deposited on the silicon oxide film 180, the semiconductor device 100 is completed.

The manufacturing method of the semiconductor device according to the instant embodiment uses the bulk silicon substrate 110, and can form the silicon oxide film 150 without using ion implantation that is required when using SIMOX. Therefore, crystalline defects and crystal dislocation are reduced in the semiconductor region, i.e. the SOI region, as compared with a BOX region made by using SIMOX.

Upon forming a SOI structure in the peripheral circuit region, the memory cell region is protected beforehand by photolithography, and the SOI structure is formed only in the peripheral circuit region by SIMOX technique. After that, through the process of FIG. 5A and the process of FIG. 6D, it is possible to form a relatively thick BOX oxide film (150 nm thick, for example) in the peripheral circuit region and a thinner silicon oxide film 150 (10 nm thick, for example) in the memory cell region. As a result, in the memory cell region, since the distance between the semiconductor region 120 and the doped polysilicon 130 is reduced, the capacitance between the semiconductor region 120 and the doped polysilicon 130 increases. In the peripheral circuit region, the thick BOX oxide film enables high-speed operations of the transistor formed in the SOI region, free from influences of the silicon substrate 110 under the BOX oxide film.

Figure 8:
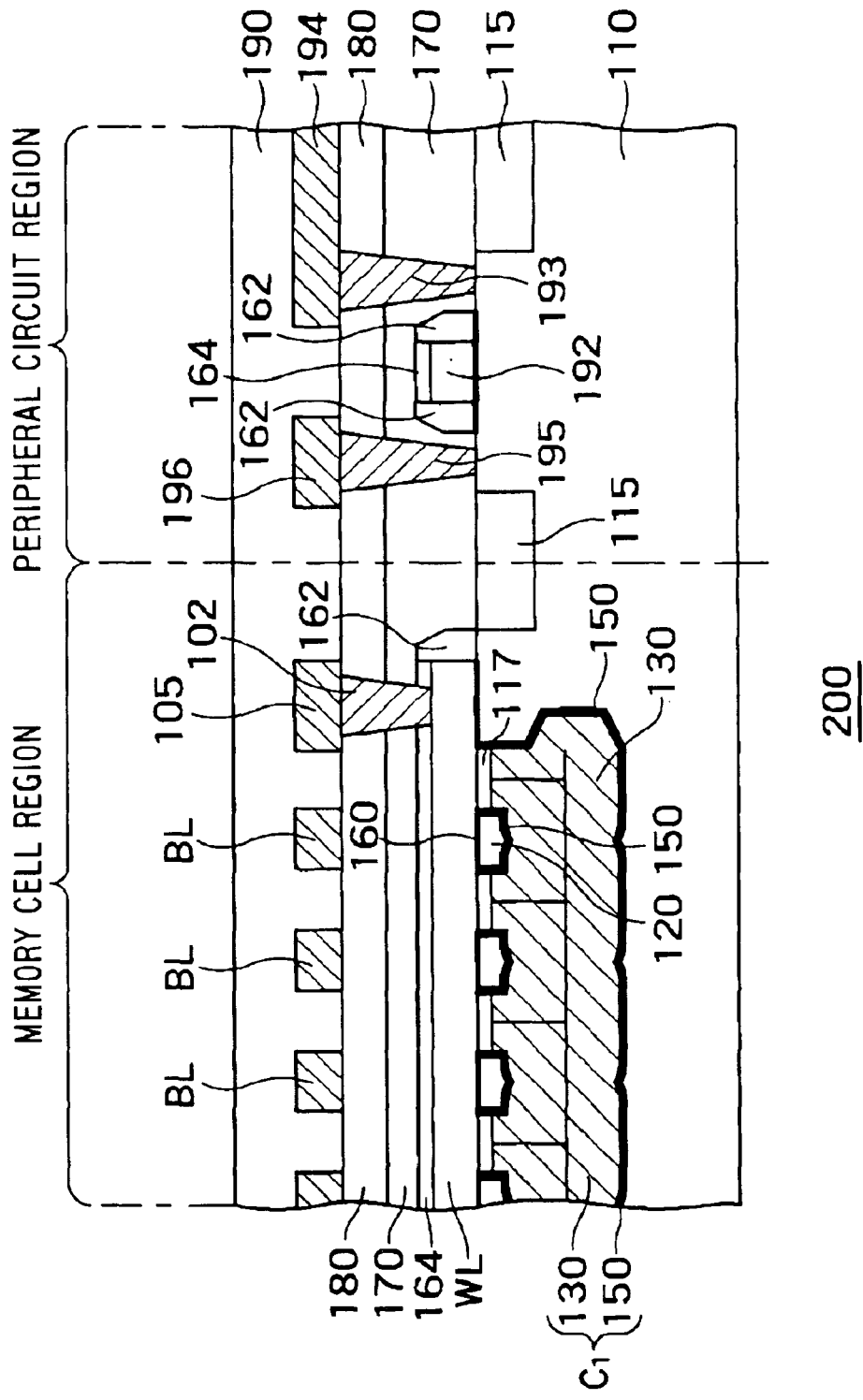
FIG. 8 is a cross-sectional view of a semiconductor device 200 according to the second embodiment of the invention.

FIG. 8 is a cross-sectional view of a semiconductor device 200 according to the second embodiment of the invention. The semiconductor device 200 is different from the first embodiment in the point that the cavity region $C_1$ is filled with the silicon oxide film 150 and the doped polysilicon 130 and that the cavity 140 does not exist. The cross-sectional view of FIG. 8 is taken along a plane corresponding to the plane of section of FIG. 4A. Other plane or cross-sectional views of this embodiment are omitted.

According to this embodiment, since no cavity 140 exists in the cavity region $C_1$, the semiconductor device is enhanced in resistance to a mechanical force from above the cavity region $C_1$.

Figure 9:
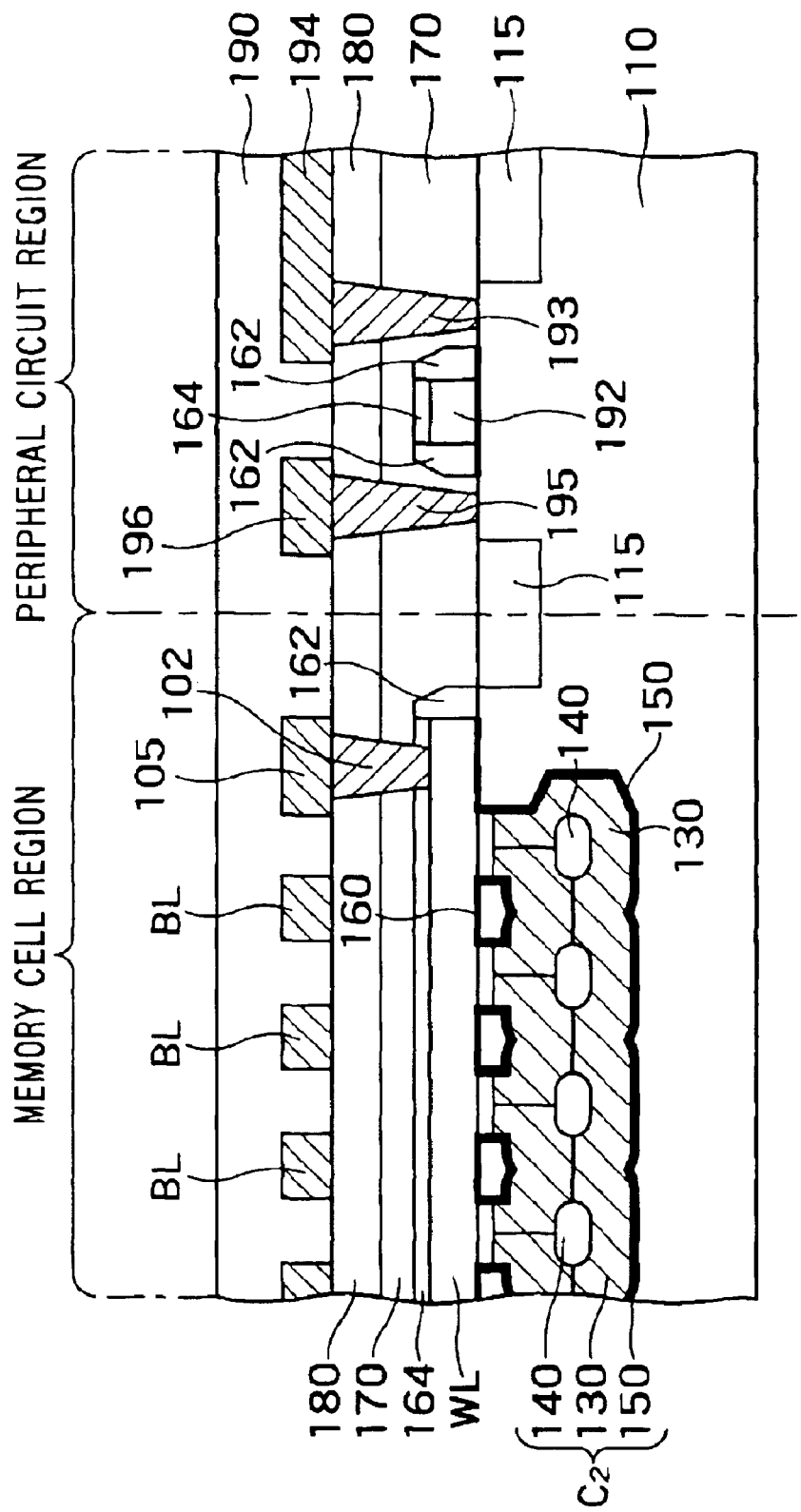
FIG. 9 is a cross-sectional view of a semiconductor device 300 according to the third embodiment of the invention.

FIG. 9 is a cross-sectional view of a semiconductor device 300 according to the third embodiment of the invention. The semiconductor device 300 is different from the first embodiment in the point that the cavity 140 is not continuous in the cavity region $C_2$ but discrete cavities intermittently appear in the lengthwise direction of the doped polysilicon 130. According to this embodiment, each cavity 140 is positioned below the boundary between every adjacent semiconductor regions 120. Straight below each semiconductor region 120, the doped polysilicon 130 exists instead of a cavity 140.

The cross-sectional view of FIG. 9 is taken along a plane corresponding to the plane of section of FIG. 4A. Here again, other plan or cross-sectional views of this embodiment are omitted.

According to this embodiment, since the doped polysilicon 130 lies straight below the semiconductor regions 120, the semiconductor regions are supported from below as well. Therefore, the semiconductor regions 120 are physically stable. Additionally, the cavities 140 below boundaries of adjacent semiconductor regions 120 relax the stress applied to the semiconductor regions 120.

The semiconductor devices 200, 300 can be manufactured by using the same manufacturing method as that of the semiconductor device 100 and changing the width of the aperture 205a of each trench 205 shown in FIGS. 5A and 7B. For example, the aperture 205a is relatively narrowed when manufacturing the semiconductor device 100 such that, in the process for depositing doped polysilicon, the doped polysilicon deposited on sidewalls of the semiconductor regions 120 plugs the apertures 205a earlier. Once the apertures 205a are plugged, the doped polysilicon cannot be deposited any more in the cavity region C. Therefore, the cavity 140 remains as shown in FIG. 6A.

For manufacturing the semiconductor device 200, the trenches 205 are formed to open more widely than for manufacturing the semiconductor device 100 such that the doped polysilicon fills the cavity region $C_1$ before it plugs the apertures 205a of the trenches 205.

For manufacturing the semiconductor device 300, the trenches are formed to open wider than for manufacturing the semiconductor device 100 and narrower than for manufacturing the semiconductor device 200 to ensure that the doped polysilicon 130 already exists straight below the semiconductor regions 120 whereas discrete cavities remain below boundaries between adjacent semiconductor regions 120 when the doped polysilicon plugs the apertures 205a of the trenches.

As explained above, the manufacturing method of a semiconductor device explained above can manufacture any of the semiconductor devices according to the first to third embodiments by simply adjusting the opening width of the trenches 205.

Figure 10:
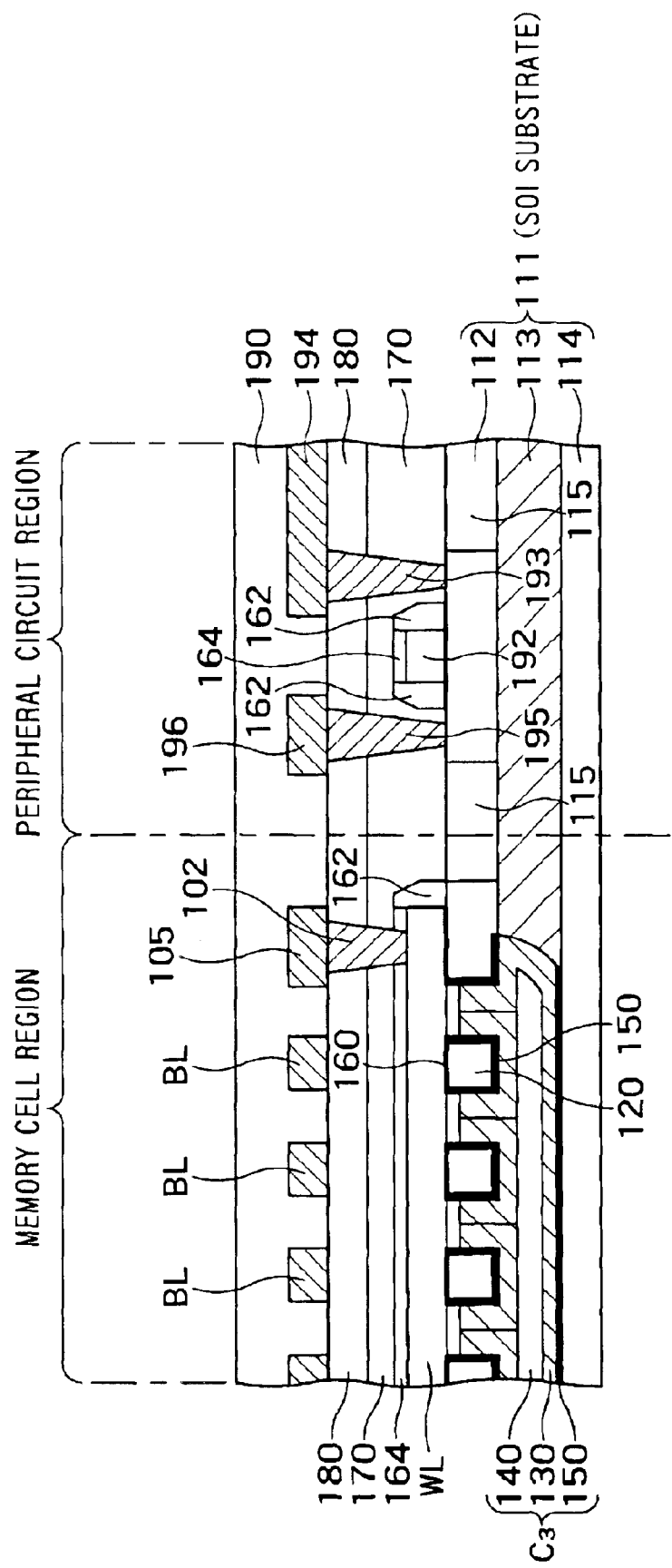
FIG. 10 is a cross-sectional view of a semiconductor device 400 according to the fourth embodiment of the invention.

FIG. 10 is a cross-sectional view of a semiconductor device 400 according to the fourth embodiment of the invention. This embodiment uses a SOI substrate 111 made of a silicon substrate 114, BOX layer 113 and SOI layer 112.

In the embodiment shown here, the cavity region $C_3$ is made by etching the BOX layer 113 of silicon oxide unlike the first to third embodiments that partly remove the silicon substrate 110 by etching. Therefore, bottom surfaces of the semiconductor regions 120 are flat without tapers.

In the fourth embodiment, however, the doped polysilicon 130 is formed via a silicon oxide film 150 that is much thinner than the BOX layer 113. Furthermore, the cavity 140 is formed inside the doped polysilicon 130. Moreover, components formed on the top surface of the SOI substrate 111 are also identical to those of the first embodiment.

Therefore, the semiconductor device 400 according this embodiment have the same effects as those of the first embodiment except the effect by tapers on the bottom surfaces of the semiconductor regions 120. Additionally, this embodiment has the following effects.

Since this embodiment uses the SOI substrate prepared by a bonding technique, it can increase the operation speed of the elements formed in the peripheral circuit region more than the first to third embodiments by maintaining the BOX layer 113 in the peripheral circuit region.

Figure 11A:
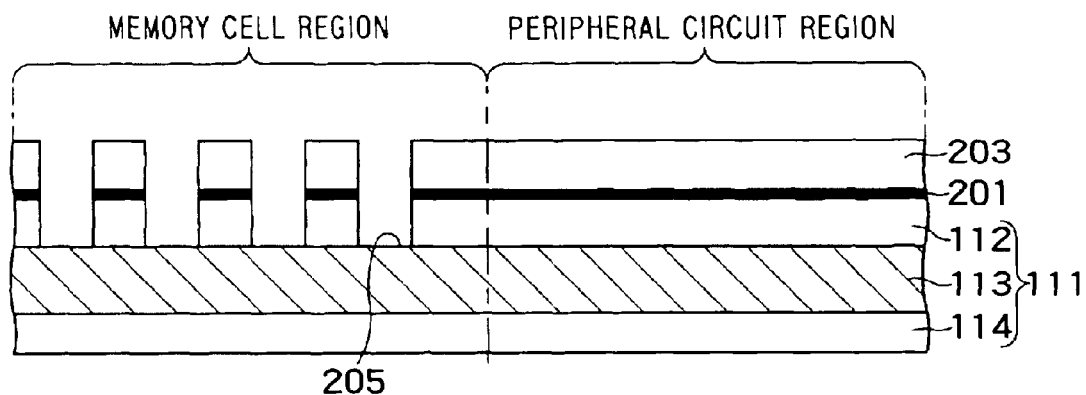
FIG. 11A is a cross-sectional view showing a manufacturing method of the semiconductor device 400.
Figure 11B:
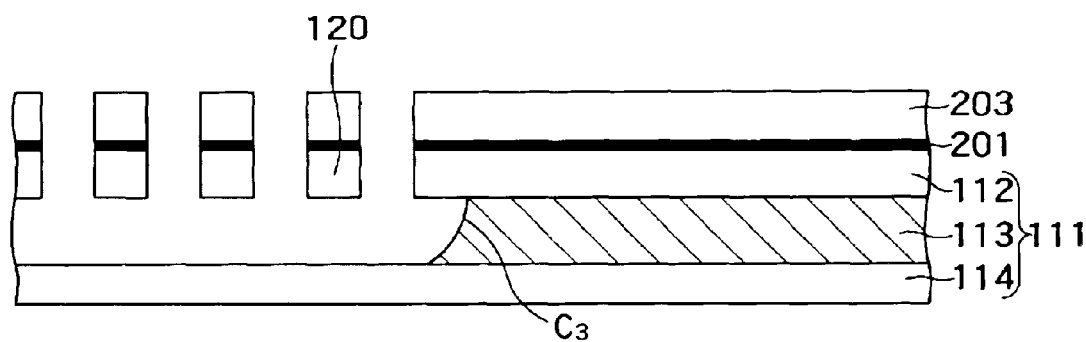
FIG. 11B is a cross-sectional view showing a manufacturing step of the semiconductor device 400 following FIG. 11A.
Figure 11C:
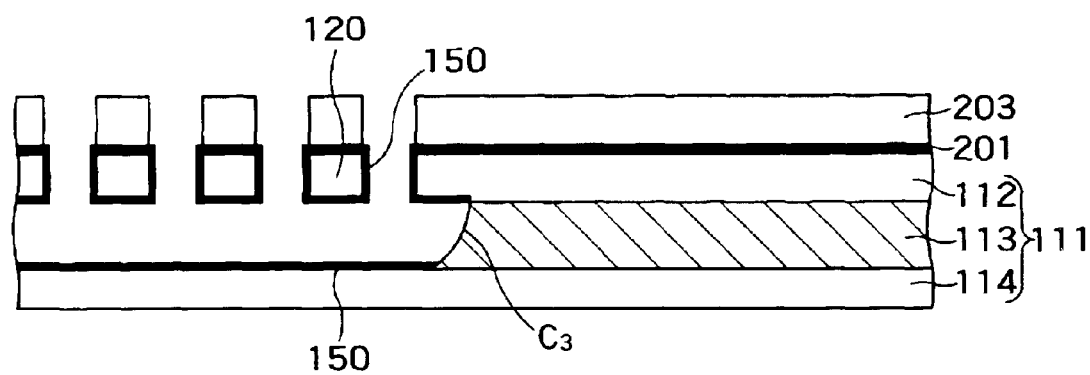
FIG. 11C is a cross-sectional view showing a manufacturing step of the semiconductor device 400 following FIG. 11B.

FIGS. 11A through 11C are cross-sectional views showing a manufacturing method of the semiconductor device 400 in the order of processes. Here again, a SOI substrate 111 made by bonding is used.

With reference to FIG. 11A, a SOI substrate 111 is first prepared, and a silicon oxide film 201, approximately 5 nm thick, is formed on the silicon substrate 110 to protect its surface. Thereafter, a silicon nitride film 203 is deposited on the silicon oxide film 201 to a thickness around 150 nm by CVD. Then the silicon oxide film 201 and the silicon nitride film 203 are patterned by photolithography and RIE.

Using the silicon nitride film 203 as a mask, the SOI substrate 111 is etched by RIE to form trenches 205 in the FBC memory cell region. Depth of the trenches 205 is approximately 300 nm from the top surface of the SOI substrate 111. In the instant embodiment, width of each trench 205 and distance between adjacent trenches 205 are approximately 150 nm, respectively.

As shown in FIG. 11B, wet etching using hydrofluoric acid is carried out to selectively remove the BOX layer 113 from the memory cell region. Etching thickness of the BOX layer 113 is approximately 200 nm. As a result, cavity regions $C_3$ and semiconductor regions 120 are made out. The semiconductor device 400 in the step shown in FIG. 11B appears identically to FIG. 7B in its plan view.

As shown in FIG. 11C, side and bottom surfaces of the semiconductor regions 120 and inner walls of the cavity regions $C_3$ are annealed in an oxygen atmosphere. As a result of this annealing, the silicon oxide film 150 is formed on side and bottom surfaces of the semiconductor regions 120 and on inner walls of the cavity regions $C_3$. Thickness of the silicon oxide film 150 is approximately 10 nm.

After that, through the steps already explained in conjunction with FIGS. 6A through 6D, the semiconductor device 400 shown in FIG. 10 is completed.

Since this manufacturing method uses the SOI substrate 111 prepared by bonding, the design of elements in the peripheral circuit region compatible to SOI substrates by bonding can be used directly without any changes.

Figure 12:
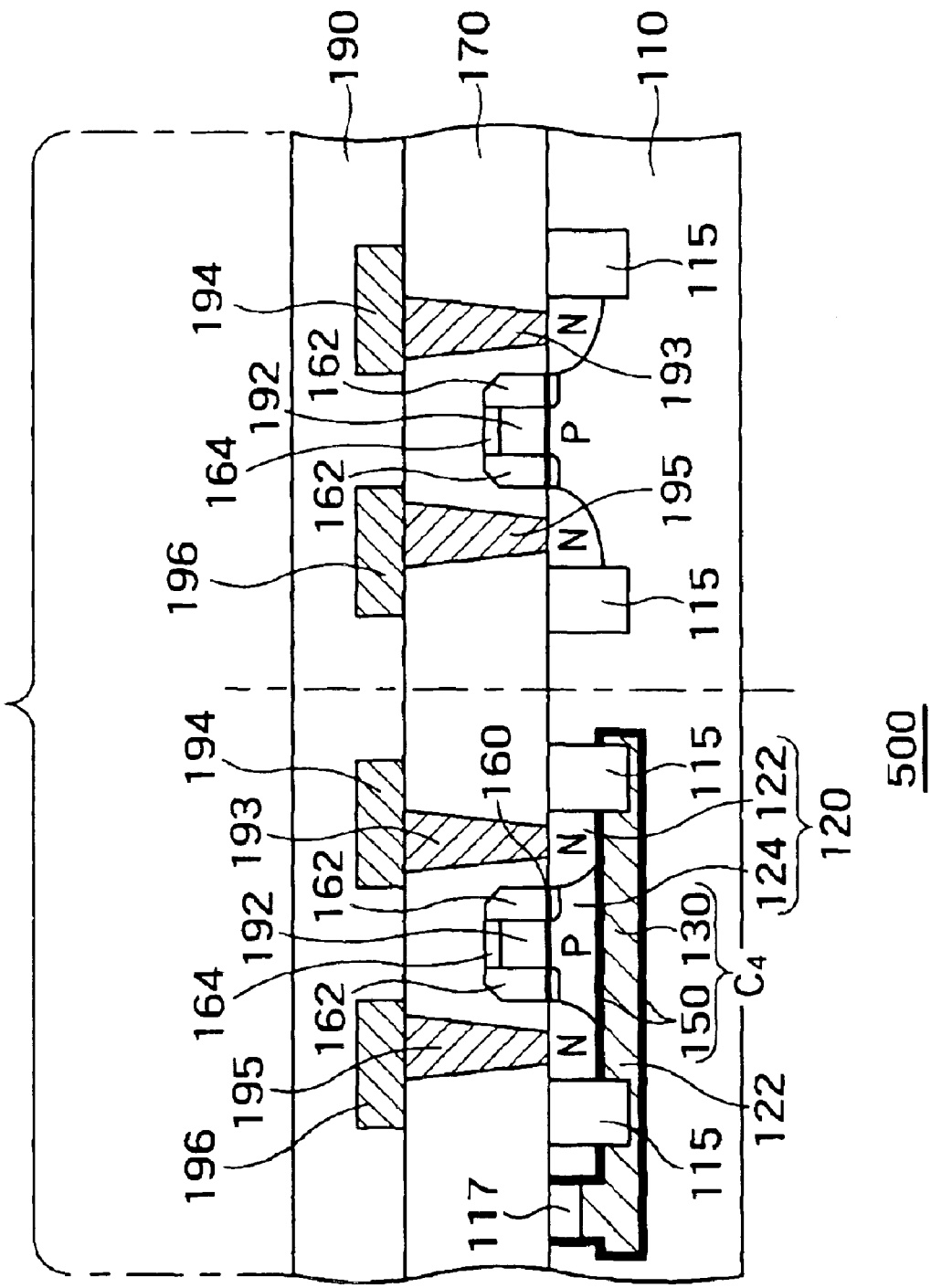
FIG. 12 is a cross-sectional view of a semiconductor device 500 according to the fifth embodiment of the invention.

FIG. 12 is a cross-sectional view of a semiconductor device 500 according to the fifth embodiment of the invention. Here is shown the peripheral circuit region of the semiconductor device 500 in a cross-sectional view, and the memory cell region is omitted from illustration. In the memory cell region, FBC memory cells may be formed, or other memory cells of a conventional type may be formed. The instant embodiment is applicable to logic LSI not including memory cell region as well.

The transistor shown on the right of the broken line in FIG. 12 has the same configuration as the transistor formed in the peripheral circuit region of the first embodiment. The transistor shown on the left of the broken line is formed in a semiconductor region 120 (hereinafter called SOI region 120 as well). FIG. 12 illustrates the source/drain diffusion layers together.

The SOI region 120 is composed of N-type semiconductor regions 122 and P-type semiconductor regions 124 that are alternately adjacent to one another. The cavity region $C_4$ underlies the SOI region 120, and the silicon oxide film 150 covers the inner wall of the cavity region $C_4$. Furthermore, doped polysilicon 130 fill the interior of the cavity portion $C_4$ via the silicon oxide film 150.

Isolation portions 115 of a silicon oxide are formed along side surfaces of the SOI region 120. Thus the SOI region 120 is isolated along its bottom and side surfaces and held in a floating state.

The gate insulation film 160 is formed on the top surface of the SOI region 120, and the gate electrode 192 is formed on the gate insulation film 160. The P-type semiconductor region 122 of the SOI region 120 underlies the gate insulation film 160, and two N-type semiconductor regions 122 are provided adjacent to the P-type semiconductor region 124. One of these N-type semiconductor regions 122 is connected to the source electrode 195, and the other is connected to the drain electrode 193. Thus a transistor having the P-type semiconductor region 124 as its channel region is composed.

The doped polysilicon 130 functions as a back gate electrode. That is, when a voltage is applied to the drain electrode 193 and the doped polysilicon 130, channels are formed in a portion of the P-type semiconductor region 124 near the doped polysilicon 130 in addition to a portion near the drain electrode 193.

Next explained is a manufacturing method of the semiconductor device 500. FIGS. 13A through 14D are cross-sectional views showing the manufacturing method of the semiconductor device 500 in the order of its processes.

Figure 13A:
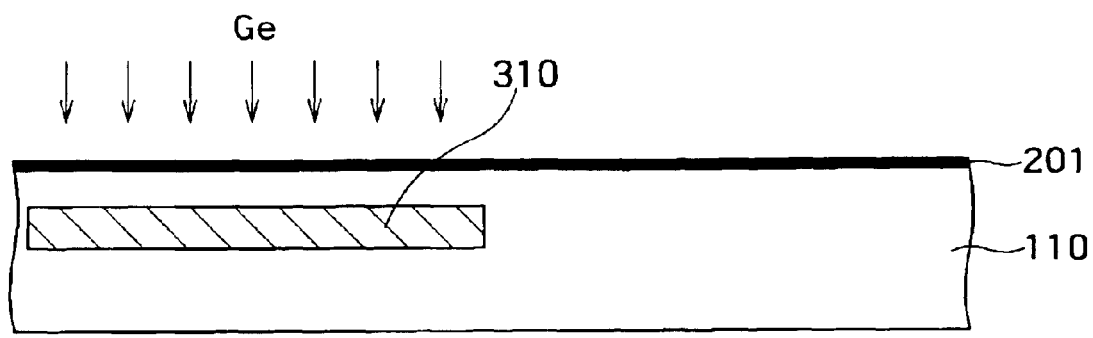
FIG. 13A is a cross-sectional view showing a manufacturing method of the semiconductor device 500.

As shown in FIG. 13A, a bulk silicon substrate 110 is prepared, and an oxide film 201 of a thickness around 5 nm is formed on the top surface of the silicon substrate 110. Germanium (Ge) ions are injected into the region for forming SOI to a depth approximately from 100 nm to 200 nm from the top surface of the silicon substrate 110. As a result, a Ge impurity layer 310 is formed. The material to be injected is not limited to germanium, and any other appropriate impurity may be used. Also, the above-mentioned depth of injection of germanium approximately from 100 nm to 200 nm is not limitative.

Figure 13B:
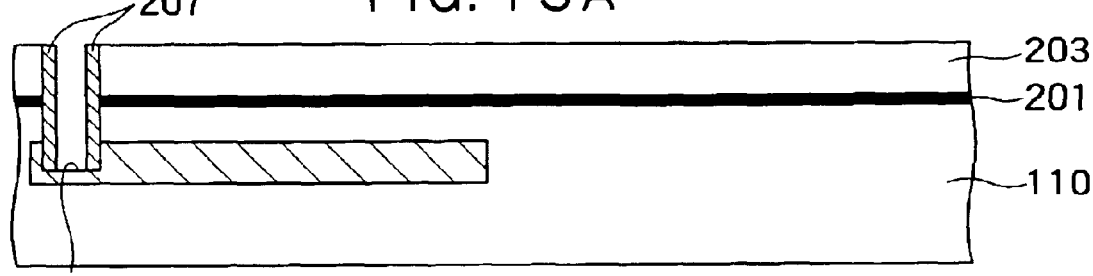
FIG. 13B is a cross-sectional view showing a manufacturing step of the semiconductor device 500 following FIG. 13A.

As shown in FIG. 13B, a silicon nitride film 203 is next deposited on the silicon oxide film 201 to a thickness around 150 nm by CVD. Then the silicon oxide film 201 and the silicon nitride film 203 are patterned by photolithography and RIE. Furthermore, using the silicon nitride film 203 as a mask, part of the semiconductor region overlying the impurity layer 310 is locally etched. As a result, a trench 205 having a diameter around 300 nm and reaching the impurity layer 310 is made out.

After that, a silicon oxide film such as TEOS is deposited to a thickness around 50 nm by CVD, and it is selectively etched by RIE. As a result, a coating film 207 of silicon oxide is formed on side walls of the trench 205.

Figure 13C:
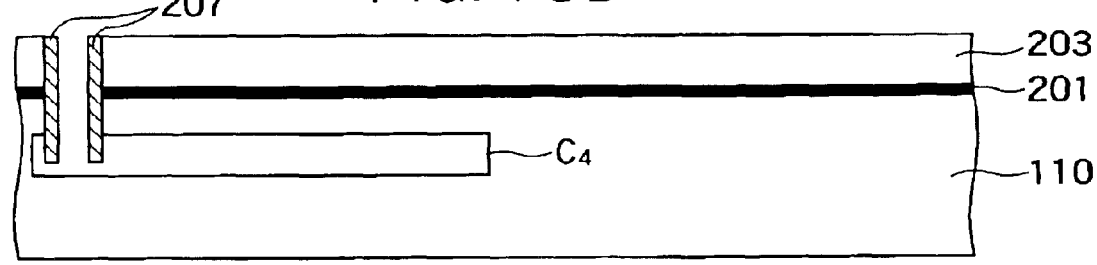
FIG. 13C is a cross-sectional view showing a manufacturing step of the semiconductor device 500 following FIG. 13B.

As shown in FIG. 13C, the impurity layer 310 is etched selectively and isotropically. This etching is CDE using $CF_4$ gas. The etching rate of the impurity layer 310 is preferably about ten times or more for silicon crystal not containing impurities. As a result, the impurity layer 310 is selectively etched, and the hollow cavity region $C_4$ is made out under the region for making SOI.

Figure 13D:
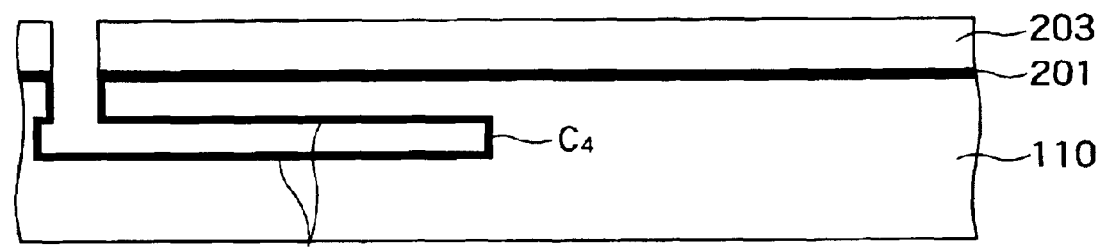
FIG. 13D is a cross-sectional view showing a manufacturing step of the semiconductor device 500 following FIG. 13C.

As shown in FIG. 13D, the coating film 207 is removed by using hydrofluoric acid, and the inner wall of the cavity region $C_4$ is annealed in an oxygen atmosphere. As a result of the annealing, the silicon oxide film 150 is formed on the inner wall of the cavity region $C_4$. Thickness of the silicon oxide film 150 is approximately 10 nm.

Figure 13E:
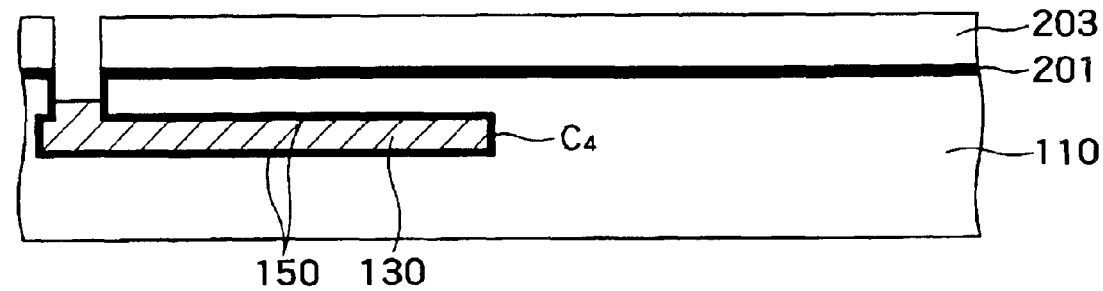
FIG. 13E is a cross-sectional view showing a manufacturing step of the semiconductor device 500 following FIG. 13D.

With reference to FIG. 13E, polysilicon doped with arsenic is deposited by CVD, and the polysilicon deposited on the top surface of the silicon substrate 110 is partly removed by etch-back. As a result, the cavity region C is filled with the doped polysilicon 130. As a result of this process, the doped polysilicon 130 having the function of a back gate of the transistor to be formed in the SOI region is formed in the cavity region C.

Figure 14A:
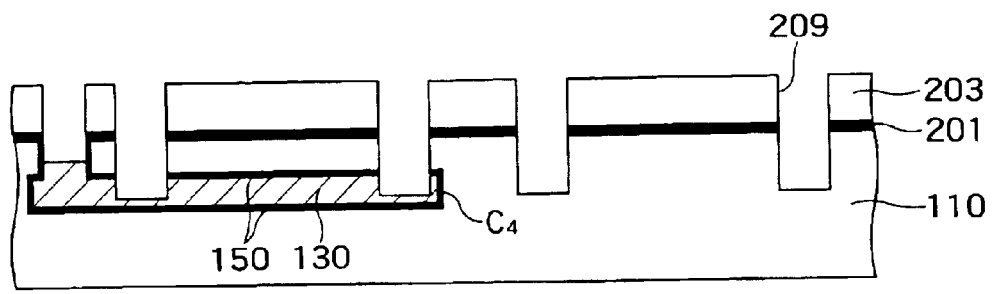
FIG. 14A is a cross-sectional view showing a manufacturing step of the semiconductor device 500 following FIG. 13E.

Referring to FIG. 14A, the silicon oxide film 201 and the silicon nitride film 203 are patterned by photolithography and RIE. Furthermore, using the nitride film 203 as a mask, the silicon substrate 110 is etched to form trenches 209.

Figure 14B:
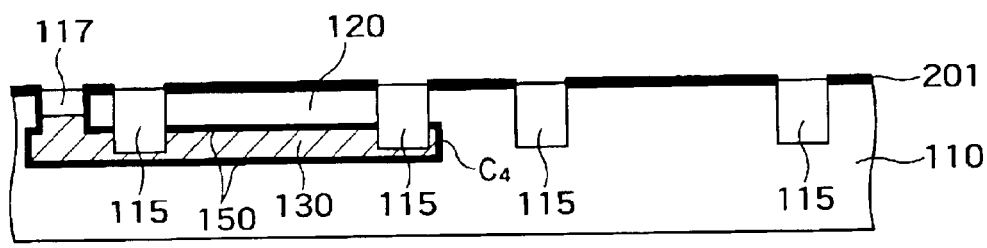
FIG. 14B is a cross-sectional view showing a manufacturing step of the semiconductor device 500 following FIG. 14A.

In FIG. 14B, a silicon oxide film is deposited, and a part thereof is removed together with the underlying silicon oxide film 201 and the silicon nitride film 203 by CMP or wet etching. Thereby, isolation portions 115 of silicon oxide are formed. In this process, a cap 117 of silicon oxide is formed simultaneously in the opening of the trench 205.

Figure 14C:
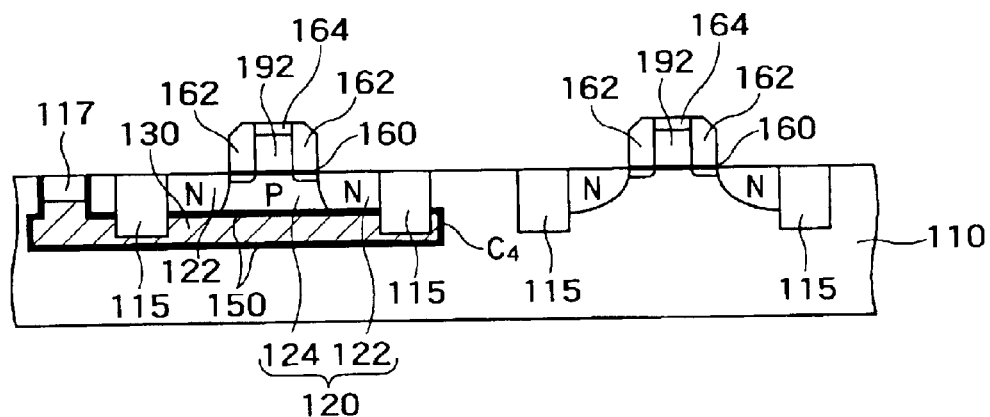
FIG. 14C is a cross-sectional view showing a manufacturing step of the semiconductor device 500 following FIG. 14B.

With reference to FIG. 14C, the top surface of the silicon substrate 110 is annealed in an oxygen atmosphere. As a result, a sacrifice oxide film (not shown) appears on the top surface of the silicon substrate 110.

After that, a well channel region is formed by photolithography and ion implantation. In this process, the P-type semiconductor region 124 is formed.

The sacrifice oxide film is removed thereafter by using hydrofluoric acid, and the gate insulation film 160 is formed subsequently on the top surface of the silicon substrate 110. In the instant embodiment, the gate insulation film 160 is a silicon oxide nitride film having a thickness around 5 nm.

After that, polysilicon is deposited on the silicon substrate 110, and the gate electrode 192 is formed by photolithography and RIE.

Thereafter, an LDD diffusion layer is formed in self-alignment with the pattern of the gate electrode 192.

In the next step, sidewalls 162 in form of a silicon nitride film are formed. Using the sidewalls 162, source/drain diffusion layers (not shown) are formed in self-alignment in the peripheral circuit region. In this process, the N-type semiconductor regions 122 are formed.

Subsequently, a cobalt film is deposited on the gate electrode 194, and it is annealed to form the silicide layer 164.

Figure 14D:
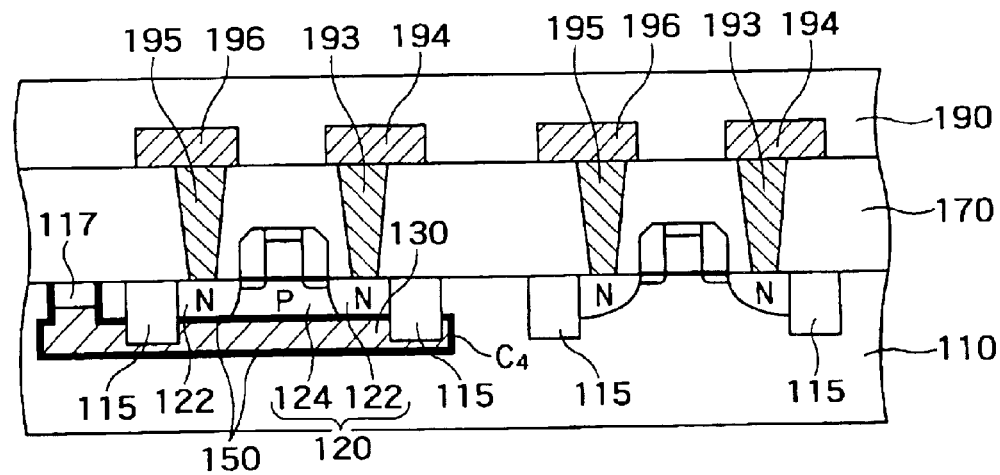
FIG. 14D is a cross-sectional view showing a manufacturing step of the semiconductor device 500 following FIG. 14C.

Referring to FIG. 14D, a BPSG film 170 is further deposited, and its surface is smoothed by CMP. After that, contacts 193, 195 are formed in the BPSG film 170. Furthermore, electrodes 194, 196 are formed, and a protection film 190 is formed on the electrodes 194, 196. As a result, the semiconductor device 500 is completed.

Since the instant embodiment forms the SOI region by injecting germanium ions as shown in FIG. 13A, the SOI region 120 can be sized freely in area and depth. For example, in case the SOI region 120 is desired to be thin and wide, germanium ions may be injected over a wide region for forming the SOI region 120 under a relatively low energy. Thereby, a transistor having a high operation speed can be formed at any desired location.

In the instant embodiment, the stress acting upon ends of the SOI region 120 is smaller than that of a SIMOX substrate. The SIMOX technique injects oxygen into a portion for making a BOX layer, and thereafter forms a silicon oxide film by annealing. Due to expansion of this silicon oxide film, a large stress acts on the boundary between the SOI region and the bulk region. In contrast, in the instant embodiment, since the polysilicon is deposited in the cavity, the stress acting on the boundary between the SOI region and the bulk region is small.

Figure 15:
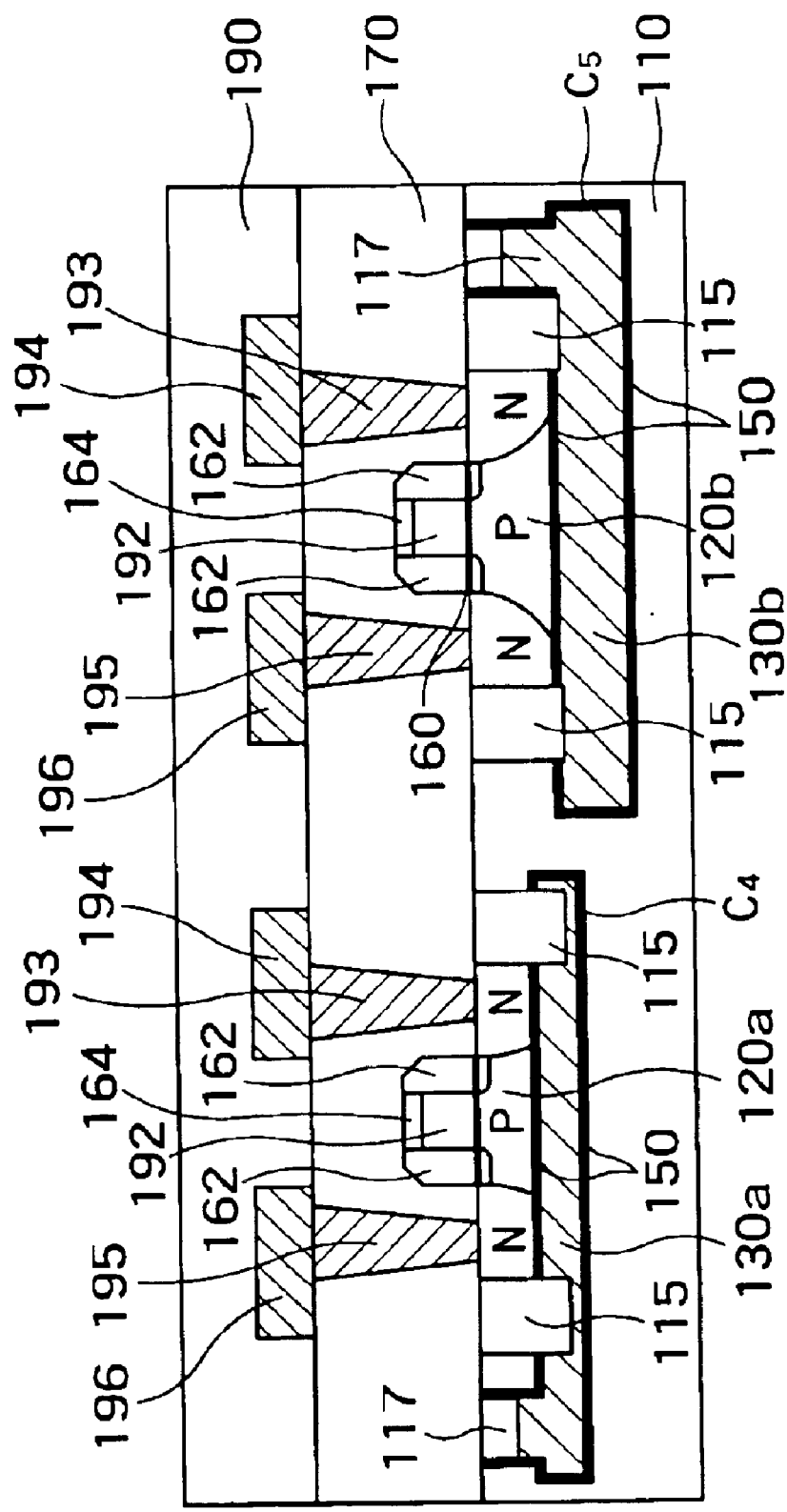
FIG. 15 is a cross-sectional view of a semiconductor device 600 according to the sixth embodiment of the invention.
Figure 16:
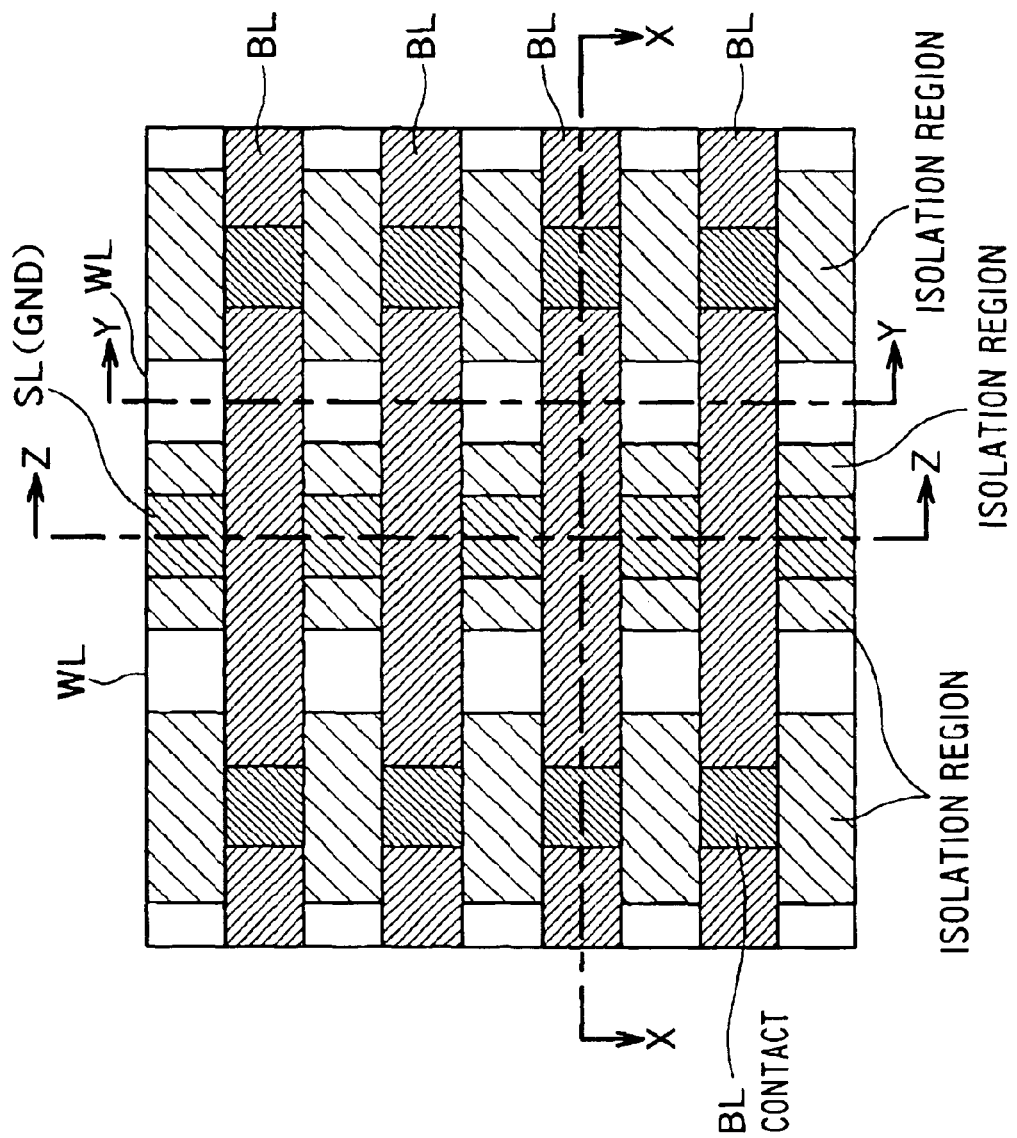
FIG. 16 is a plan view of a part of a FBC cell.
Figure 17:
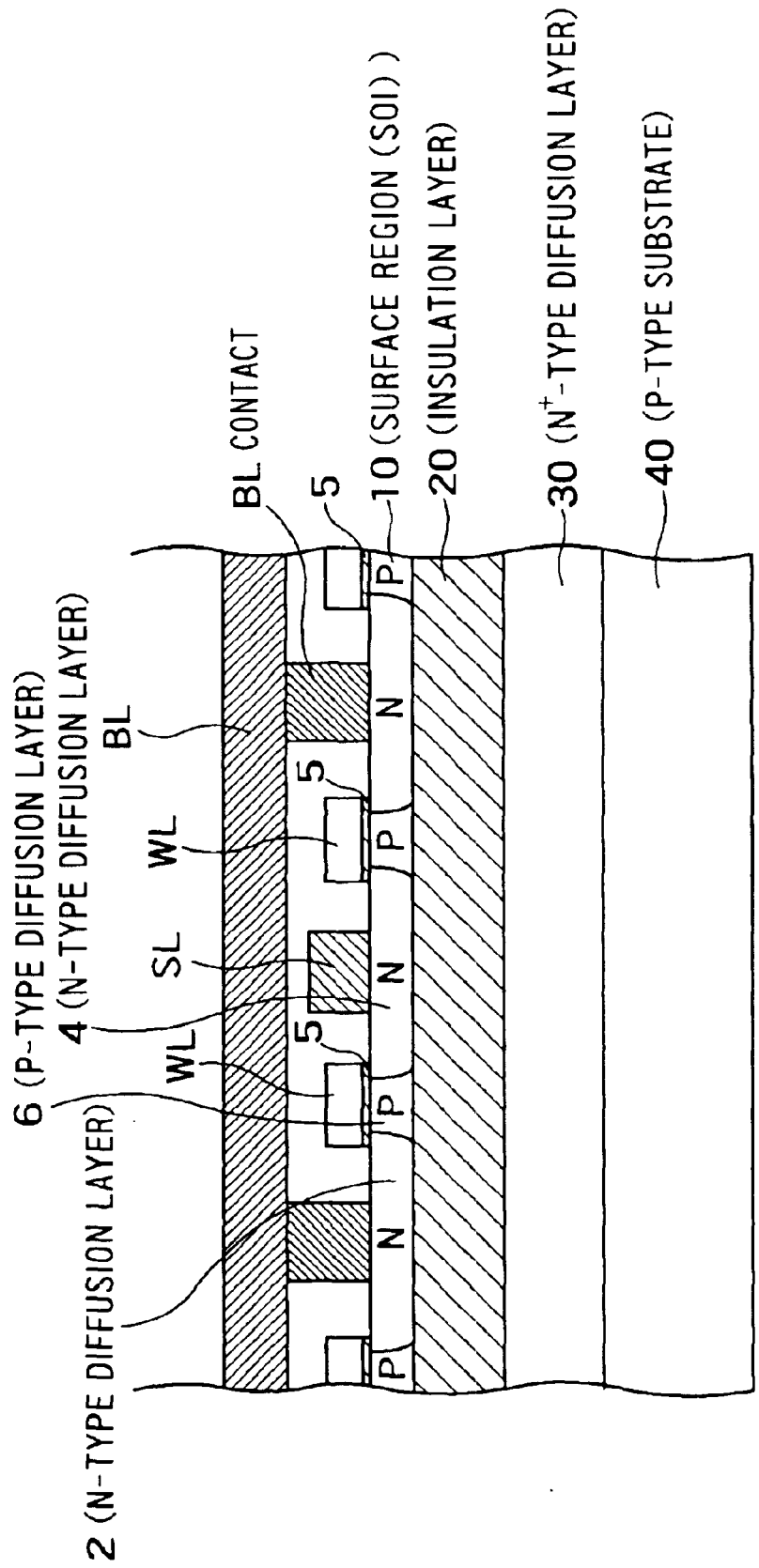
FIG. 17 is a cross-sectional view taken along the X—X line (word lines WL) of FIG. 16.

The semiconductor device 600 shown in FIG. 15 can be manufactured by making use of the manufacturing method of the semiconductor device shown in FIGS. 13A through 14D.

FIG. 15 is a cross-sectional view of a semiconductor device 600 according to the sixth embodiment of the invention. The semiconductor device 600 shown here is different from the semiconductor device 500 shown in FIG. 12 in having the SOI regions 120a and 120b that are different in thickness. The difference in thickness between the SOI regions 120a and 120b is produced because the cavity regions $C_4$ and $C_5$ formed under the SOI regions 120a and 120b are different in depth from the top surface of the silicon substrate 110. Contacts are formed for doped polysilicon 130a, 130b contained in cavity regions $C_4$, $C_5$ to enable application of a voltage from outside. For example, contact plugs (not shown) may be formed to pierce the BPSG film 170 and the cap 117, and a wiring (not shown) connected to the contact plugs may be formed on the plane common to that of bit lines BL.

In order to form cavity regions $C_4$, $C_5$ that are different in depth, injection energy for ion injection shown in FIG. 13A may be changed. That is, germanium ions having lower injection energy are injected into the region for forming the cavity region $C_4$ whereas germanium ions having higher injection energy are injected into the region for forming the deeper cavity region $C_5$.

Further through the steps of FIG. 13B to FIG. 14D, the semiconductor device 600 is completed.

Optimum thickness of the SOI region 120 varies depending upon the role of the transistor. The embodiment shown here can form transistors different in role on a common substrate.

In the embodiments heretofore explained, material of the doped polysilicon 130 is not limited to polysilicon. Instead, other conductive film, such as a metal, may be used. In case the doped polysilicon 130 need not be used as an electrode, the doped polysilicon 130 may be oxidized to form a thick BOX oxide film.

In the fifth and sixth embodiments, the silicon oxide film 150 and the cavity 140 may be formed in the cavity region $C_4$, $C_5$ without forming the doped polysilicon 130 therein. In this case, dielectric constant of the cavity region $C_4$, $C_5$ becomes lower, and a low dielectric constant is sufficient for isolating the semiconductor region 120 from the silicon substrate 114. This contributes to speed up operations of the transistor formed in the semiconductor region 120.

Semiconductor devices according to the embodiments explained above are reduced in crystalline defect in the surface region of the semiconductor substrate for forming elements, hence capable of reliably retaining data, and reduced in cost as well.

Manufacturing methods of semiconductor devices according to embodiments explained above can manufacture semiconductor devices according to any embodiments of the invention at a low cost.

What is claimed is:

1. A semiconductor device comprising:
   a semiconductor substrate having a cavity region inside;
   a first insulation film formed on the inner wall of the cavity region;
   a first electrode formed on the inner wall of the first insulation film in the cavity region, and having a hollow cavity inside;

a semiconductor region overlying the cavity region and including first semiconductor regions of a first conductivity type and second semiconductor regions of a second conductivity type which are adjacent to each other, said semiconductor region having a bottom surface on which the first electrode is formed via the first insulation film;

a second insulation film covering the top surface of the semiconductor region; and a second electrode formed on the semiconductor region via the second insulation film and electrically insulated from the semiconductor region and the first electrode.

2. A semiconductor device according to claim 1, wherein the first insulation film covers the bottom surface and side surfaces of the semiconductor region with substantially uniform thickness.

3. A semiconductor device according to claim 2, wherein thickness of the first insulation film is 10 nm or less.

4. A semiconductor device according to claim 1, wherein the bottom surface of the semiconductor region is tapered to point downward.

5. A semiconductor device according to claim 1, wherein a single said first electrode is associated with a plurality of said second electrodes.

6. A semiconductor device according to claim 1, wherein said cavity intermittently appears in the horizontal direction of the semiconductor substrate.

7. A semiconductor device according to claim 1, wherein thickness of the first insulation film is 10 nm or less.

8. A semiconductor device according to claim 1, wherein the semiconductor region has formed a memory element, and wherein a peripheral circuit region around the semiconductor region in the surface region of the semiconductor substrate has formed a transistor having the second insulation film as a gate insulation film and the second electrode as a gate electrode.

9. A semiconductor device according to claim 8, wherein the peripheral circuit region is a SOI region having a semiconductor layer on an insulation layer, and wherein the first insulation film is thinner than the insulation layer of the SOI region.

10. A semiconductor device according to claim 1, wherein the semiconductor region is a floating region electrically isolated from the semiconductor substrate.

11. A semiconductor device comprising:

a semiconductor substrate having a cavity region inside;

a first insulation film formed on the inner wall of the cavity region;

a first gate electrode filled inside the first insulation film in the cavity region, and electrically insulated from the semiconductor region by the first insulation film;

a semiconductor region overlying the cavity region and including first semiconductor regions of a first conductivity type and second semiconductor regions of a second conductivity type which are adjacent to each other, said semiconductor region having a bottom surface on which the first gate electrode is formed via the first insulation film;

a second insulation film formed on the top surface of the semiconductor region;

a third insulation film thicker than the first insulation film and the second insulation film and covering side surfaces of the semiconductor region; and a second gate electrode formed on the top surface of the semiconductor region via the second insulation film and electrically insulated from the semiconductor region and the first gate electrode.

12. A semiconductor device according to claim 11, wherein the semiconductor region includes a first semiconductor region having a thickness relatively larger from the top surface of the semiconductor substrate and a second semiconductor region having a thickness relatively smaller from the top surface of the semiconductor substrate.

13. A semiconductor device according to claim 11, wherein the semiconductor region is a floating region electrically isolated from the semiconductor substrate.

14. A method of manufacturing a semiconductor device, comprising:

forming a trench in a surface region of a semiconductor substrate;

forming a coating film covering sidewalls of the trench;

etching isotropically the semiconductor substrate from the bottom of the trench to make a hollow cavity having an extension in the horizontal direction relative to the top surface of the semiconductor substrate and an extension in the vertical direction relative to the top surface of the semiconductor substrate; and forming a first insulation film on side surfaces and a bottom surface of a semiconductor region overlying the cavity in the semiconductor substrate, forming a first electrode inside the cavity, the first electrode being insulated from the semiconductor region via the first insulation film;

forming a second insulation film on the top surface of the semiconductor region; and forming a second electrode on the top surface of the semiconductor region, said second electrode being insulated from the semiconductor region via the second insulation film.

15. A method according to claim 14, further comprising:

forming a plurality of trenches close to each other at the time of forming the trench; and etching isotropically the semiconductor substrate from bottoms of the respective trenches to merge the cavities of the trenches adjacent to each other when the semiconductor substrate is etched.

16. A method according to claim 15, further comprising:

determining side surfaces of the semiconductor region by the trenches; and determining the bottom surface of the semiconductor region by the cavity after etching the semiconductor substrate.

17. A method of manufacturing a semiconductor device, comprising:

forming a trench in a surface region of a semiconductor substrate;

forming a coating film covering sidewalls of the trench;

etching isotropically the semiconductor substrate from the bottom of the trench to make a hollow cavity having an extension in the horizontal direction relative to the top surface of the semiconductor substrate and an extension in the vertical direction relative to the top surface of the semiconductor substrate;

forming an element in a semiconductor region overlying the cavity in the semiconductor substrate, including forming a first insulation film substantially uniform in thickness on side surfaces and a bottom surface of the semiconductor region, forming a first electrode insulated from the semiconductor region via the first insulation film on side surfaces and bottom surface of the semiconductor region, forming a second insulation film on the top surface of the semiconductor region, and forming a second electrode on a top surface of the semiconductor region, said second electrode being insulated from the semiconductor region and the first electrode via the second insulation film.

18. A method according to claim 17, further comprising:

forming a memory element in the semiconductor region during forming the element;

forming the second insulation film on the top surface of the semiconductor substrate in the peripheral circuit region around the semiconductor region during forming the second insulation film, said second insulation film being used as a gate insulation film of a transistor in the peripheral circuit region;

forming the second electrode on the insulation film in the peripheral circuit region during forming the second electrode, said second electrode being used as a gate electrode of the transistor.

19. A method of manufacturing a semiconductor device, comprising:

forming a plurality of trenches in a SOI substrate having a semiconductor layer on an insulation layer, said trenches extending from the top surface of the semiconductor layer and reaching the insulation layer of the SOI substrate;

etching isotropically the insulation layer of the SOI substrate from the bottom of the trench, and removing a part of the insulation layer underlying the semiconductor layer between adjacent trenches;

forming a first insulation film substantially uniform in thickness on the bottom surface and side surfaces of a semiconductor region, said semiconductor region being the part of the semiconductor layer without the insulation layer below;

forming a first electrode insulated from the semiconductor layer on side surfaces and bottom surface of the semiconductor region via the first insulation film;

forming a second insulation film on the top surface of the semiconductor region; and forming a second electrode insulated from the semiconductor region and the first electrode on the semiconductor region via the second insulation film.

20. A method according to claim 19, further comprising:

forming a memory cell in the semiconductor region;

forming the second insulation film on the top surface of the semiconductor substrate in the peripheral circuit region around the semiconductor region during forming the second insulation film, said second insulation film being used as a gate insulation film of a transistor in the peripheral circuit region; and forming the second electrode on the gate insulation film in the peripheral circuit region during forming the second electrode, said second electrode being used as a gate electrode of the transistor.

21. A method of manufacturing a semiconductor device, comprising:

injecting impurity ions from the top surface of a semiconductor substrate and thereby forming an impurity layer;

forming a trench from the top surface of the semiconductor substrate to reach the impurity layer;

forming a coating film which covers side walls of the trench;

etching isotropically the semiconductor substrate from the bottom of the trench and thereby removing the impurity region in a horizontal direction relative to the top surface of the semiconductor substrate; and forming a first insulation film on side surfaces and a bottom surface of a semiconductor region overlying a cavity made by the removal of the impurity layer, forming a first electrode inside the hollow cavity, the first electrode being insulated from the semiconductor region via the first insulation film, forming a second insulation film on the top surface of the semiconductor region, and forming a second electrode on the top surface of the semiconductor region, said second electrode being insulated from the semiconductor region via the second insulation film.

22. A method of manufacturing a semiconductor device, comprising:

injecting impurity ions from the top surface of a semiconductor substrate and thereby forming an impurity layer;

forming a trench from the top surface of the semiconductor substrate to reach the impurity layer;

forming a coating film which covers side walls of the trench;

etching isotropically the semiconductor substrate from the bottom of the trench and thereby removing the impurity region in a horizontal direction relative to the top surface of semiconductor substrate;

forming an element in a semiconductor region overlying a cavity made by the removal of the impurity layer, including forming a first insulation film on a bottom surface of the semiconductor region, depositing a first electrode inside the cavity, said first electrode being insulated from the semiconductor region by the first insulation film, forming a second insulation film on a top surface of the semiconductor region, and forming a second electrode on the top surface of the semiconductor region via the second insulation film, the second electrode being insulated from the semiconductor region and the first gate electrode by the second insulation film.

23. A method according to claim 22, wherein a transistor using the first electrode and the second electrode altogether as gate electrodes is formed in the semiconductor region.

* * * * *